(12) United States Patent
Kubo et al.

(10) Patent No.: US 10,074,542 B2
(45) Date of Patent: Sep. 11, 2018

(54) SUBSTRATE PROCESSING METHOD AND SUBSTRATE PROCESSING APPARATUS

(71) Applicant: TOKYO ELECTRON LIMITED, Tokyo (JP)

(72) Inventors: Akihiro Kubo, Koshi (JP); Teruhiko Kodama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 183 days.

(21) Appl. No.: 15/267,183

(22) Filed: Sep. 16, 2016

(65) Prior Publication Data
US 2017/0092504 A1 Mar. 30, 2017

(30) Foreign Application Priority Data
Sep. 28, 2015 (JP) .................................. 2015-190053

(51) Int. Cl.
| | |
|---|---|
| *B24B 37/20* | (2012.01) |
| *H01L 21/304* | (2006.01) |
| *H01L 21/67* | (2006.01) |
| *H01L 21/02* | (2006.01) |
| *H01L 21/308* | (2006.01) |

(52) U.S. Cl.
CPC ............ *H01L 21/304* (2013.01); *B24B 37/20* (2013.01); *H01L 21/02052* (2013.01); *H01L 21/3043* (2013.01); *H01L 21/3086* (2013.01); *H01L 21/6704* (2013.01); *H01L 21/67092* (2013.01)

(58) Field of Classification Search
CPC . B24B 37/20; H01L 21/304; H01L 21/02052; H01L 21/3043; H01L 21/3086; H01L 21/6704; H01L 21/67092

USPC ......................................... 451/41, 66, 57–58
See application file for complete search history.

(56) References Cited

U.S. PATENT DOCUMENTS

| | | | | |
|---|---|---|---|---|
| 4,276,114 A | * | 6/1981 | Takano | ............. H01L 21/02008 148/DIG. 61 |
| 5,302,554 A | * | 4/1994 | Kashiwa | ............... H01L 21/304 148/DIG. 28 |
| 5,305,559 A | * | 4/1994 | Ogawa | ................. G11B 5/1871 451/54 |
| 5,700,179 A | * | 12/1997 | Hasegawa | ................. B24B 7/06 451/190 |
| 7,507,146 B2 | * | 3/2009 | Kato | ....................... B24B 9/065 257/E21.214 |
| 7,763,577 B1 | * | 7/2010 | Chang | ..................... C11D 1/123 438/692 |
| 7,910,157 B2 | * | 3/2011 | Terada | ............. H01L 21/67219 427/331 |
| 9,144,881 B2 | * | 9/2015 | Nakao | ................... B24B 37/345 |
| 2001/0014570 A1 | * | 8/2001 | Wenski | ................... B24B 9/065 451/41 |

(Continued)

FOREIGN PATENT DOCUMENTS

| | | | | |
|---|---|---|---|---|
| CN | 104733385 A | * | 6/2015 | ............. H01L 21/78 |
| EP | 0951056 A2 | * | 10/1999 | ........... H01L 21/304 |
| JP | 2011-171732 A | | 9/2011 | |

*Primary Examiner* — George Nguyen

(74) *Attorney, Agent, or Firm* — Nath, Goldberg & Meyer; Jerald L. Meyer

(57) ABSTRACT

There is provided a substrate processing method which includes polishing a rear surface of a substrate before a pattern exposure such that the rear surface is subjected to a roughening treatment; and bypassing a roughness alleviating treatment with respect to the polished rear surface of the substrate.

8 Claims, 21 Drawing Sheets

(56) References Cited

U.S. PATENT DOCUMENTS

| | | | | |
|---|---|---|---|---|
| 2003/0013380 A1* | 1/2003 | Arai | ............ | B24B 7/228 |
| | | | | 451/6 |
| 2005/0054205 A1* | 3/2005 | Tanaka | ............ | G03F 7/40 |
| | | | | 438/706 |
| 2008/0153391 A1* | 6/2008 | Erk | ............ | B24B 9/065 |
| | | | | 451/36 |
| 2008/0176376 A1* | 7/2008 | Kobayashi | ............ | B41M 5/24 |
| | | | | 438/401 |
| 2008/0176491 A1* | 7/2008 | Sekiya | ............ | B24B 37/042 |
| | | | | 451/57 |
| 2008/0280544 A1* | 11/2008 | Kobayashi | ............ | B24B 37/00 |
| | | | | 451/177 |
| 2009/0311522 A1* | 12/2009 | Sato | ............ | B24B 9/065 |
| | | | | 428/338 |
| 2011/0130073 A1* | 6/2011 | Furukawa | ............ | B24B 37/042 |
| | | | | 451/6 |
| 2011/0189928 A1* | 8/2011 | Shin | ............ | H01L 21/67005 |
| | | | | 451/41 |
| 2012/0088441 A1* | 4/2012 | Yamanaka | ............ | H01L 21/304 |
| | | | | 451/402 |
| 2012/0187547 A1* | 7/2012 | Nemoto | ............ | H01L 21/304 |
| | | | | 257/622 |
| 2014/0106649 A1* | 4/2014 | Kim | ............ | H01L 21/6835 |
| | | | | 451/54 |
| 2016/0343629 A1* | 11/2016 | Rajoo | ............ | H01L 24/29 |

* cited by examiner

The number of revolutions 15rpm

The number of revolutions 30rpm

The number of revolutions 300rpm

The number of revolutions 15rpm

The number of revolutions 30rpm

The number of revolutions 15rpm
Ra 3.8nm
Dynamic friction coefficient 0.422

The number of revolutions 30rpm
Ra 5.7nm
Dynamic friction coefficient 0.382

FIG. 31
| The number of revolutions during polishing | No polishing | Wafer rotation 15rpm | Wafer rotation 30rpm | Wafer rotation 300rpm |
|---|---|---|---|---|
| OL map (Wafer Image) | 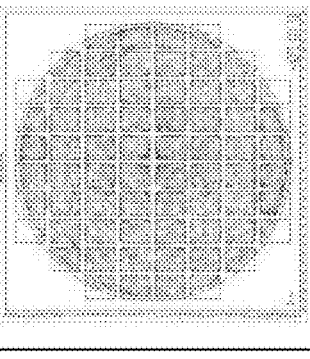 | 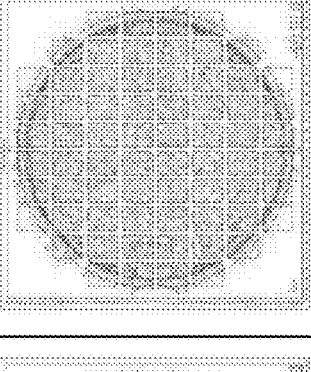 | 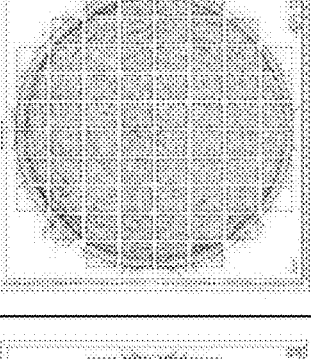 | 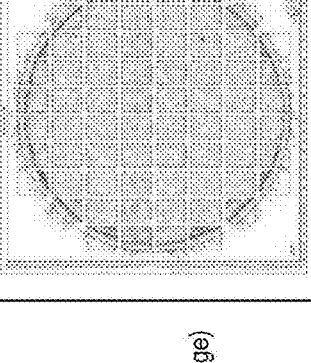 |
| OL | x:8.4nm/y:8.8nm | x:9.3nm/y:9.7nm | x:9.8nm/y:9.9nm | x:6.3nm/y:7.5nm |
| OL improvement rate (%) | 0.0% | -10.5% | -14.5% | 19.5% |

SUBSTRATE PROCESSING METHOD AND SUBSTRATE PROCESSING APPARATUS

CROSS-REFERENCE TO RELATED APPLICATION

This application claims the benefit of Japanese Patent Application No. 2015-190053, filed on Sep. 28, 2015, in the Japan Patent Office, the disclosure of which is incorporated herein in its entirety by reference.

TECHNICAL FIELD

The present disclosure relates to a substrate processing method which performs a process on a substrate as a semiconductor wafer before a pattern exposure, and a substrate processing apparatus.

BACKGROUND

A semiconductor device includes a multilayer wiring structure. In order to form the multilayer wiring structure in a semiconductor device manufacturing procedure, a photolithography process of forming a resist pattern as a mask pattern for forming a wiring, is performed a plurality of times on a semiconductor wafer as a substrate (hereinafter, referred to as a "wafer"). Between respective photolithography processes, an exposure treatment is performed such that shots are performed in the same region of the wafer. As the wiring of the semiconductor device is miniaturized, it is requested that the accuracy of positional alignment between a region where a shot is performed in a previous photolithography process and a region where a shot is performed in a subsequent photolithography process, namely, the accuracy of overlay (superposition), is increased.

However, the wafer is mounted on a stage installed in an exposure device, and is sucked toward a surface of the stage by suction ports formed in the stage. An exposure shot is performed in the state where a position of the wafer is fixed on the stage. In this way, the wafer is subjected to an exposure treatment. However, there may be a case where a wafer conveyed to an exposure device is not flat and has distorted portions. If such a wafer is mounted on the stage, an exposure shot may be performed on the wafer which is sucked to the stage while being distorted. In such a case, the exposure shot is performed in a region that deviates away from a region where the shot is to be normally performed. This causes a limit in enhancing the accuracy of the overlay. In the related art, there is known a technique for detecting an error related to an overlay using a scatterometer, and controlling an operation of a scanner for performing exposure based on the detected error. However, this technique does not take into consideration the problem encountered when mounting the distorted wafer on the stage. Thus, this technique is not capable of solving the aforementioned problem.

SUMMARY

The present disclosure is to provide a technique which is capable of preventing an exposure position of a substrate from deviating from a normal position during a pattern exposure.

According to one embodiment of the present disclosure, there is provided a substrate processing method includes: polishing a rear surface of a substrate before a pattern exposure such that the rear surface is subjected to a roughening treatment; and bypassing a roughness alleviating treatment with respect to the polished rear surface of the substrate.

According to another embodiment of the present disclosure, there is provided a substrate processing apparatus which forms a resist film on a substrate and develops the substrate after a pattern exposure, including: a polishing treatment part configured to polish a rear surface of the substrate such that the rear surface of the substrate is subjected to a roughening treatment before the pattern exposure, wherein a roughness alleviating treatment is not performed on the polished rear surface.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 31 is an explanatory view illustrating an image obtained by an evaluation experiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
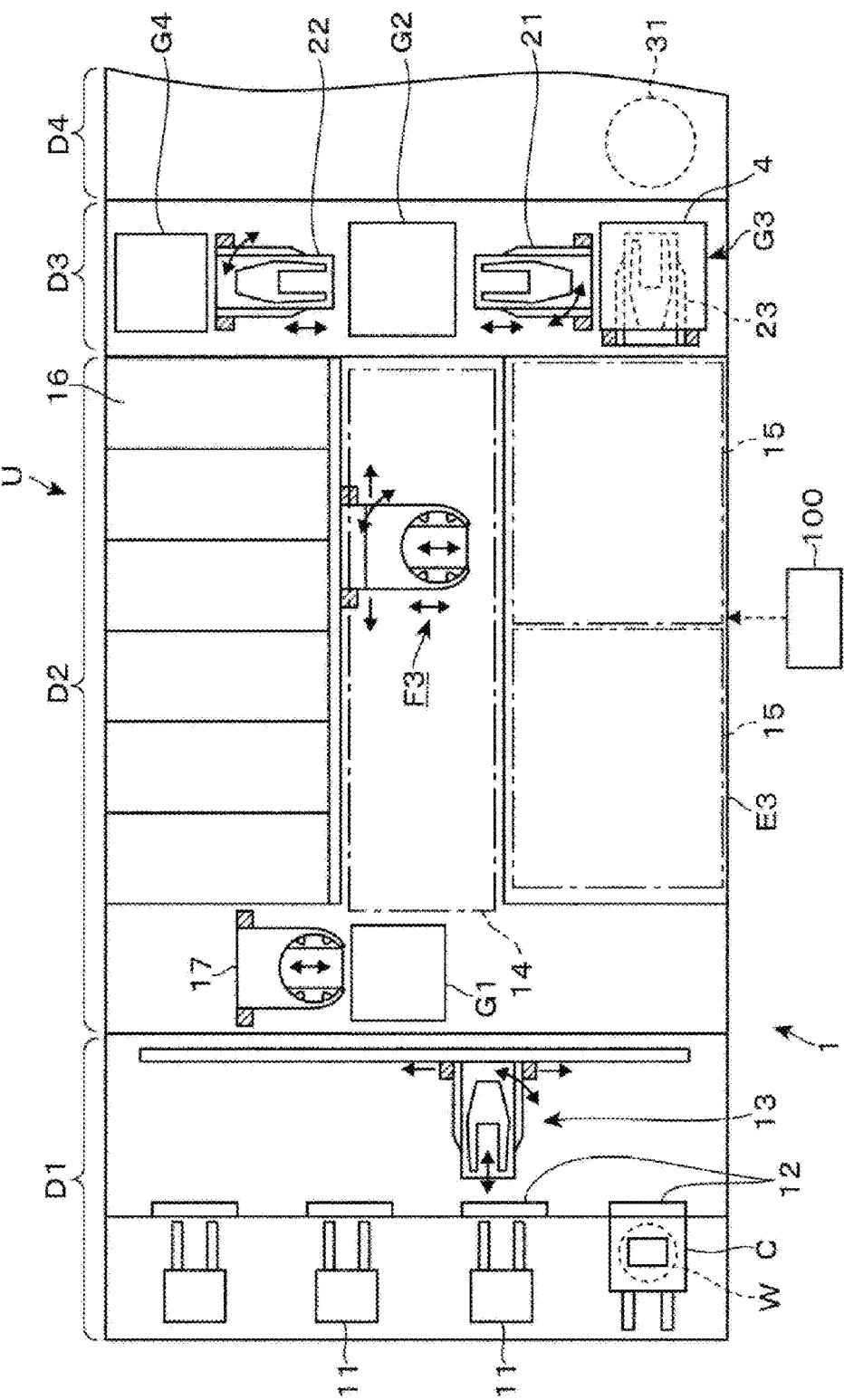
FIG. 1 is a detailed plan view of a coating/developing apparatus.
Figure 2:
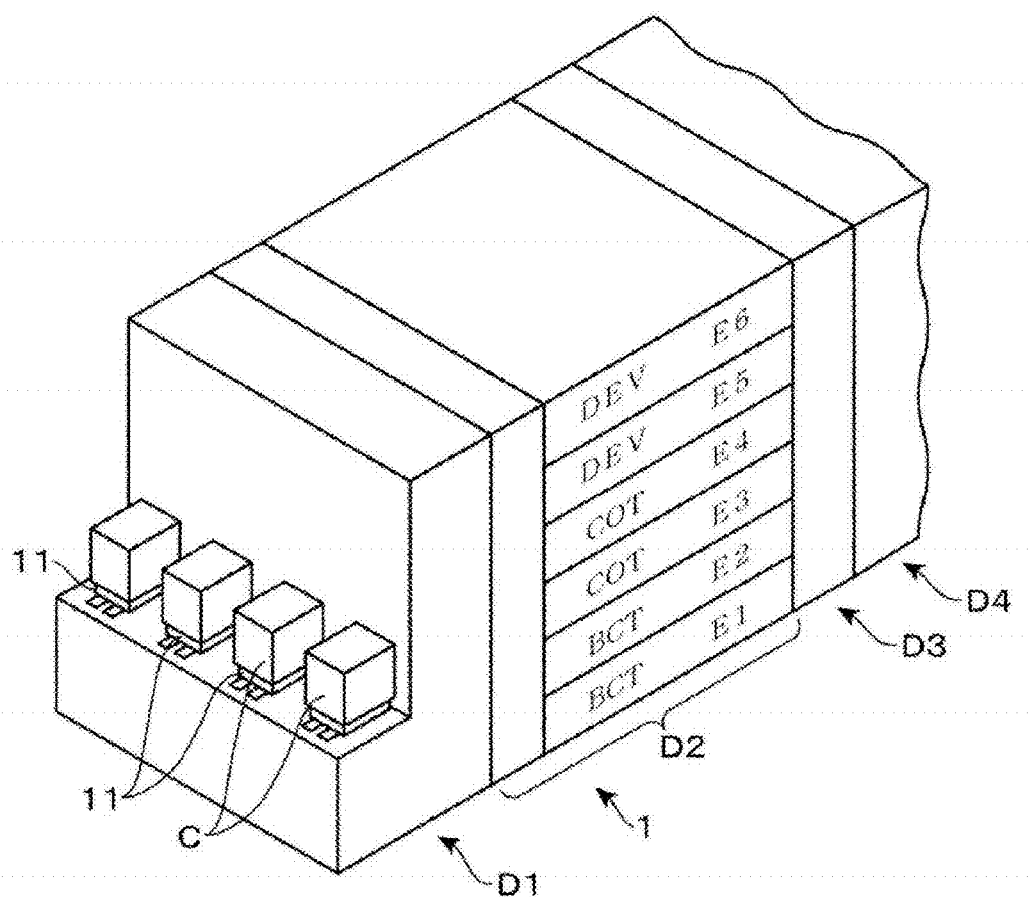
FIG. 2 is a perspective view of the coating/developing apparatus.
Figure 3:
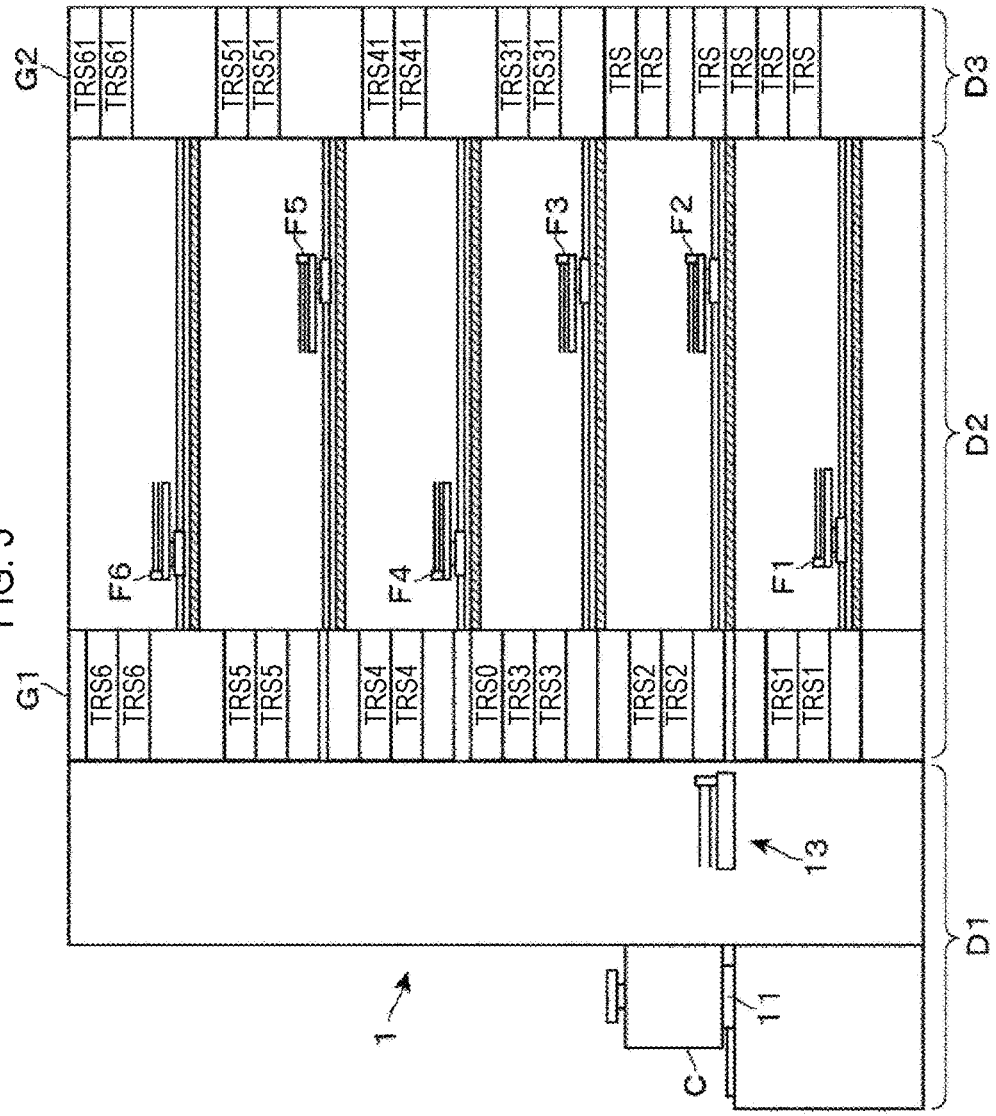
FIG. 3 is a schematic vertical sectional side view of the coating/developing apparatus.

A substrate processing system including a coating/developing apparatus 1 which carries out a substrate processing method of the present disclosure and an exposure device D4 will be described with reference to FIGS. 1 to 3. FIGS. 1 to 3 are a plan view, a perspective view, and a schematic vertical sectional side view of a coating/developing apparatus 1, respectively. The coating/developing apparatus 1 is configured by linearly connecting a carrier block D1, a processing block D2, and an interface block D3 to each other. An exposure device D4 is connected to the interface block D3. In the following description, the arrangement direction of the blocks D1 to D3 will be referred to as a front-back direction. A carrier C configured to receive a wafer W as a circular substrate, is conveyed into the carrier block D1 from outside of the coating/developing apparatus 1. The carrier block D1 includes a mounting stand 11 on which the carrier C is mounted, an opening/closing part 12, and a transfer mechanism 13 configured to convey the wafer W from the carrier C through the opening/closing part 12.

The processing block D2 includes first to sixth unit blocks E1 to E6 which performs a liquid treatment on the wafer W, respectively, and are stacked one above another from below. For the sake of description, a treatment for forming a lower anti-reflection film on the wafer W will be referred to as "BCT," a treatment for forming a resist film on the wafer W will be referred to as "COT," and a treatment for forming a resist pattern on the wafer W after exposure will be referred to as "DEV." In this embodiment, as illustrated in FIG. 2, two BCT layers, two COT layers, and two DEV layers are stacked in this order from below. In the same unit block, transfer and treatment operations for the wafer W are performed in parallel.

Here, the third unit block E3 will be described on behalf of the unit blocks with reference to FIG. 1. At one of left and right sides of a transfer region 14 which is defined to extend from the carrier block D1 to the interface block D3, a plurality of shelf units U is arranged in the front-back direction. At the other side of the left and right sides of the transfer region 14, two resist film forming modules 15 are arranged in a line along the front-back direction. The resist film forming module 15 supplies a resist used as a chemical liquid onto the surface of the wafer W, thereby forming a resist film. Each of the shelf units U includes a plurality of heating modules 16. A transfer arm F3 as a transfer mechanism of the wafer W is installed in the transfer region 14.

Descriptions will be made on differences between the unit blocks E1, E2, E5 and E6, and the unit blocks E3 and E4. Each of the unit blocks E1 and E2 includes an anti-reflection film forming module instead of the resist film forming module 15. In the anti-reflection film forming module, a chemical liquid for forming an anti-reflection film is supplied onto the wafer W. Each of the unit blocks E5 and E6 includes a developing module instead of the resist film forming module 15. In the developing module, a developing solution as a chemical liquid is supplied onto the surface of the wafer W so that a resist film exposed in a predetermined pattern by the exposure device D4 is developed. Thus, a resist pattern is formed on the wafer W. Except for these differences, the unit blocks E1 to E6 are configured to be similar to each other. In FIG. 3, transfer arms provided in the unit blocks E1 to E6 are indicated by F1 to F6, respectively.

In the vicinity of the carrier block D1 in the processing block D2, there are installed a tower G1 configured to vertically extend across the unit blocks E1 to E6, and a delivery arm 17 used as a transfer mechanism which vertically moves with respect to the tower G1 to transfer the wafer W. The tower G1 is configured by a plurality of modules that are stacked one above another. A respective module installed at a level corresponding to each of the unit blocks E1 to E6 can transfer a wafer W between the transfer arms F1 to F6 of the respective blocks E1 to E6 and the respective modules. An example of the modules may include a delivery module TRS provided at a level of each unit block, a temperature adjustment module CPL that adjusts a temperature of the wafer W, a buffer module that temporarily stores a plurality of wafers W, a hydrophobic treatment module that hydrophobizes the surfaces of the wafers W, and so on. For the sake of simplicity, the hydrophobic treatment module, the temperature adjustment module, and the buffer module are omitted in the drawings.

The interface block D3 includes towers G2, G3, and G4 that vertically extend across the unit blocks E1 to E6, and interface arms 21 to 23 used as transfer mechanisms for transferring the wafers W with respect to the towers G2 to G4. The interface arm 21 is a vertically movable transfer mechanism that transfers the wafer W between the tower G2 and the tower G3, and the interface arm 22 is a vertically movable transfer mechanism that transfers the wafer W between the tower G2 and the tower G4. The interface arm 23 is a transfer mechanism that transfers the wafer W between the tower G2 and the exposure device D4.

The tower G2 is configured by stacking, one above another, delivery modules TRS, a buffer module that stores and holds a plurality of wafers W before an exposure treatment, a buffer module that stores a plurality of wafers W after the exposure treatment, a temperature adjustment module that adjusts a temperature of the wafer W, and so on. Herein, the buffer module and the temperature adjustment module are omitted. The tower G3 is provided with a roughening treatment module 4 to be described later. Although the tower G4 is also provided with various kinds of modules, the descriptions thereof will be omitted here.

Figure 4:
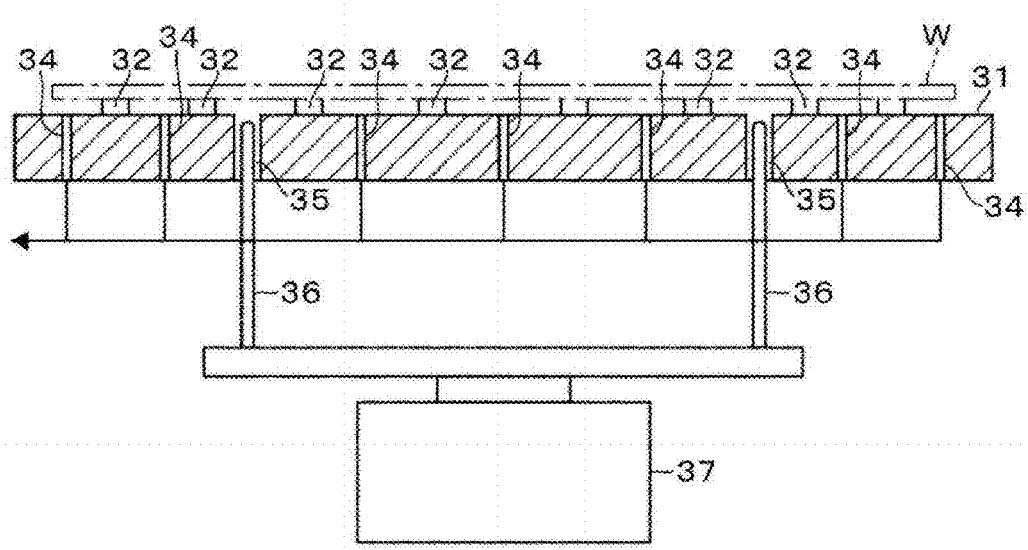
FIG. 4 is a vertical sectional side view of a stage installed in an exposure device.
Figure 5:
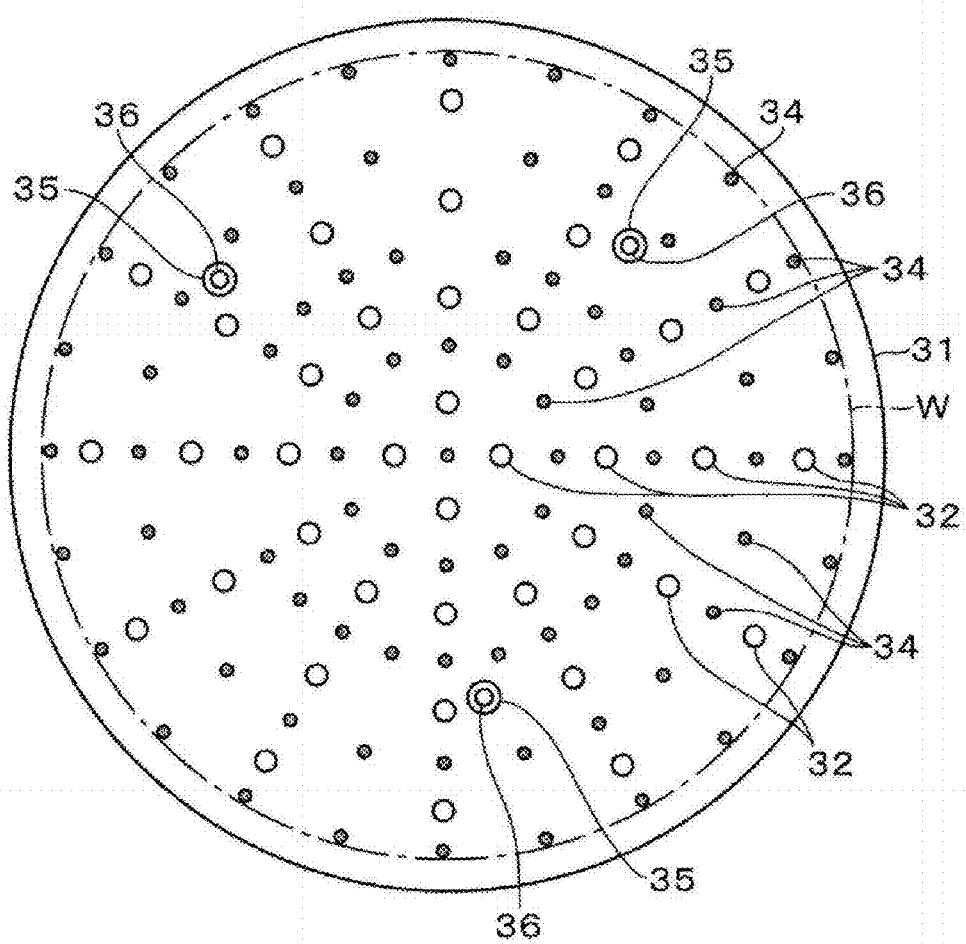
FIG. 5 is a plan view of a stage installed in the exposure device.

Next, the exposure device D4 will be described. The exposure device D4 includes a circular stage 31. FIGS. 4 and 5 are a vertical sectional side view and a plan view of the stage 31, respectively. As illustrated in FIG. 5, the wafer W is mounted on the stage 31 such that the center of the wafer W coincides with the center of the stage 31. On the surface of the stage 31, a plurality of pins 32 is arranged in a mutually spaced-apart relationship along concentric circles centered at the center of the surface of the stage 31. Top ends of the pins 32 as protrusions constitute a flat plane. The rear surface of the wafer W is supported by the flat plane. That is to say, the rear surface of the wafer W is supported to float from the surface of the stage 31.

In the surface of the stage 31, a plurality of suction ports 34 is dispersedly opened at positions that do not overlap with the pins 32. Each of the suction ports 34 is connected to an exhaust source (not illustrated). The suction ports 34 serve to suck the rear surface of the wafer W vertically downwardly so as to fix the position of the wafer W on the stage 31. For the sake of easier understanding of the drawings, the suction ports 34 are indicated by a gray scale in FIG. 5. In FIGS. 4 and 5, lift pins 36 are installed in three holes denoted by "35" (only two holes are shown in FIG. 4). Reference numeral "37" in FIG. 4 indicates a lift mechanism for moving the lift pins 36 up and down. With the up-down movement of the lift pins 36, the wafer W is transferred between the interface arm 23 and the pins 32.

Next, the roughening treatment module 4 as a polishing treatment part will be described with reference to FIGS. 6 and 7, which are a perspective view and a vertical sectional side view of the roughening treatment module 4. As will be described in detail below, in order to normally mount the wafer W on the stage 31 of the exposure device D4, the roughening treatment module 4 is a module that performs the roughening treatment by polishing the rear surface of the wafer W before the wafer W is carried into the exposure device D4. Specifically, the polishing-based roughening treatment refers to a treatment for increasing an arithmetic average roughness Ra, and, more specifically, a treatment for densely forming irregularities on the rear surface of the wafer W.

Figure 6:
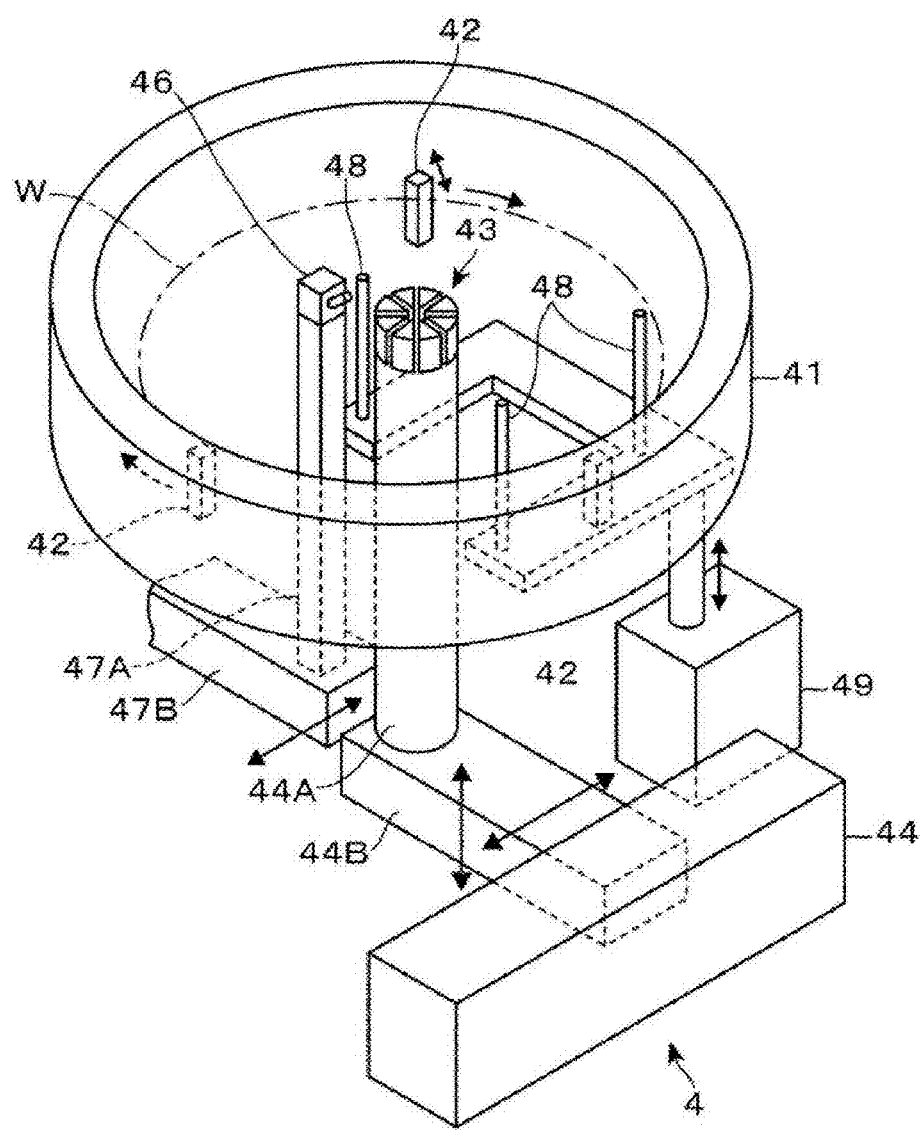
FIG. 6 is a perspective view illustrating a configuration of a roughening treatment module installed in the coating/developing apparatus.
Figure 7:
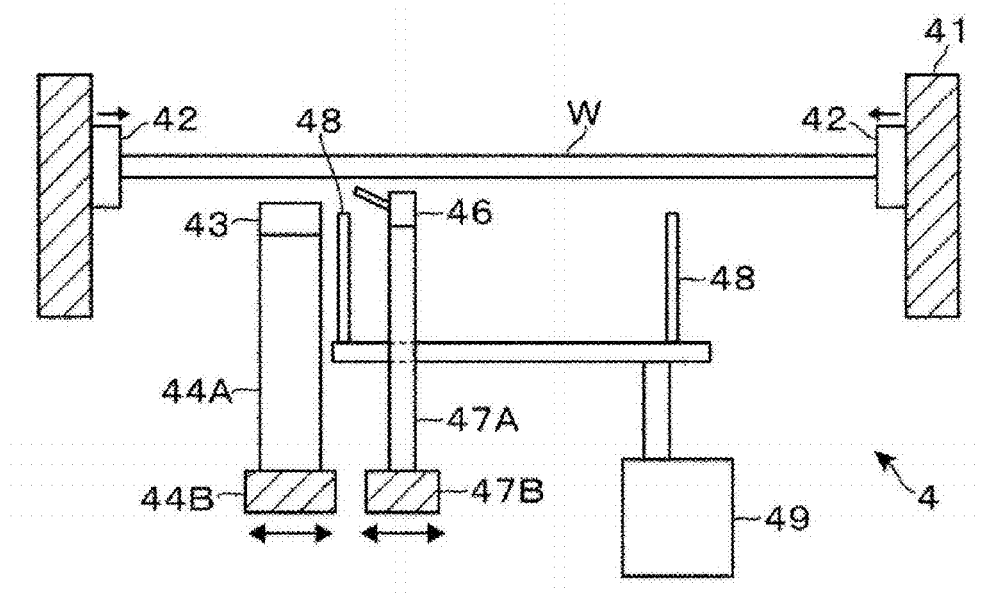
FIG. 7 is a vertical sectional side view of the roughening treatment module.

In FIGS. 6 and 7, reference numeral "41" indicates a lengthwise long horizontal ring member formed to surround a side circumference of the wafer W. A plurality of circumferential end holding parts 42 are arranged on the inner surface of the ring member 41 at a predetermined interval in a circumferential direction. Each of the circumferential end holding parts 42 presses the outer circumferential end of the wafer W surrounded by the ring member 41 toward the center of the wafer W to hold the wafer W, thereby horizontally supporting the wafer W. In addition, the circumferential end holding parts 42 are connected to a driving mechanism (not illustrated). The circumferential end holding parts 42 move along the periphery of the ring member 41 so that the wafer W supported by the circumferential end holding parts 42 can be rotated around the center thereof.

Figure 8:
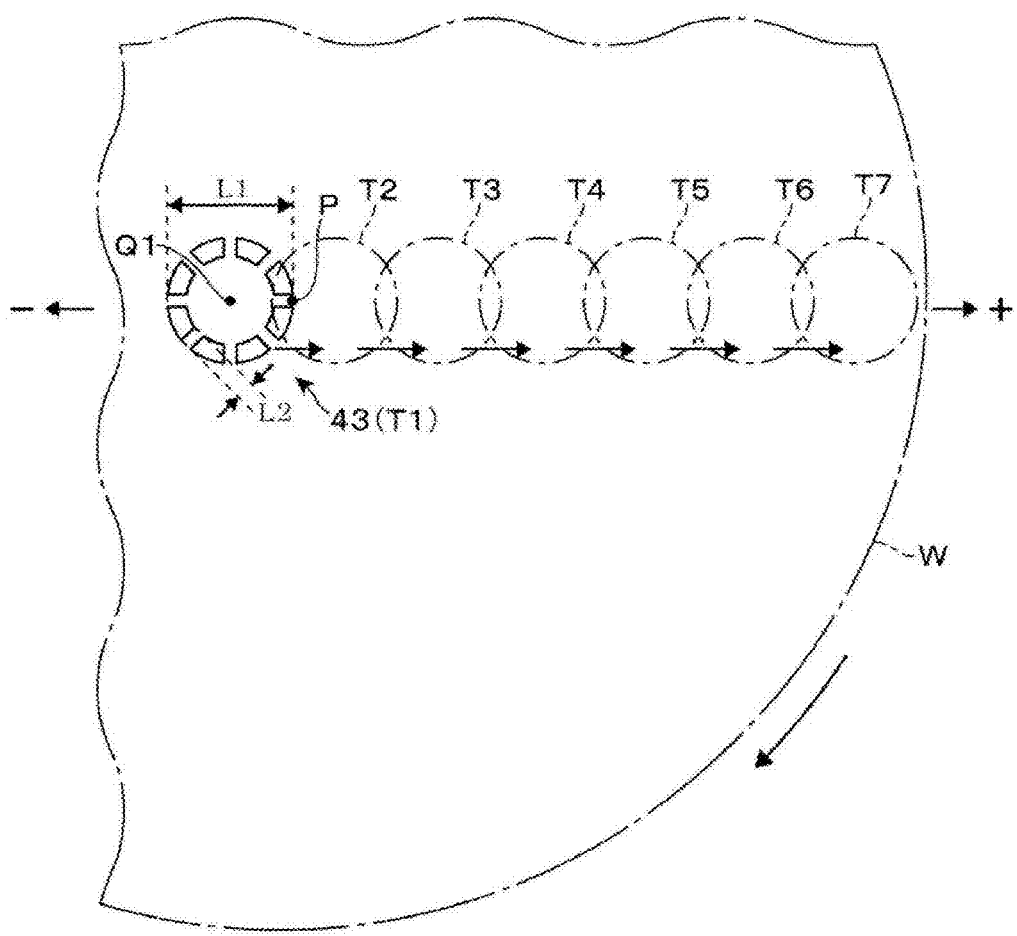
FIG. 8 is an explanatory view for explaining a movement of a grindstone installed in the roughening treatment module.

In FIGS. 6 and 7, reference numeral "43" indicates a polishing body as a grinding stone. FIG. 8 illustrates a plan view of the polishing body 43. For example, the polishing body 43 is formed in a horizontal ring shape having eight divided portions in the circumferential direction when viewed from the top. An external width of the ring-shaped polishing body 43, which is denoted by L1 in FIG. 8, is, for example, 30 mm. A radial width of the ring-shaped polishing body 43, which is denoted by L2 in FIG. 8, is, for example, 5 mm. The polishing body 43 is formed of, for example, diamonds. For example, the polishing body 43 has a grain size of 8000 grit or more. In FIGS. 6 and 7, a symbol "Q1" indicates the center of the polishing body 43, and is positioned on the diameter of the wafer W supported by the ring member 41.

In addition, as illustrated in FIGS. 6 and 7, the polishing body 43 is supported on an upper end of a vertical column 44A. A lower end of the column 44A is connected to one end of an arm 44B that extends horizontally. The other end of the arm 44B is connected to a moving mechanism 44. The polishing body 43 is configured to be movable up and down with respect to the rear surface side of the wafer W, and to be horizontally movable along the diameter of the wafer W, by the moving mechanism 44. In FIGS. 6 and 7, reference numeral "46" indicates a pure water supply nozzle which supplies pure water toward the rear surface of the wafer W. In FIGS. 6 and 7, reference numeral "47A" indicates a vertical column. The pure water supply nozzle 46 is supported on the upper end of the column 47A. In FIGS. 6 and 7, reference numeral "47B" indicates an arm to which the lower end of the column 47A is connected. The arm 47B is connected to a moving mechanism (not illustrated). This moving mechanism moves the pure water supply nozzle 46 such that a position at which the pure water is shifted along the diameter of the rear surface of the wafer W. In FIGS. 6 and 7, reference numeral "48" indicates lift pins which are moved up and down by a lift mechanism 49 and configured to transfer the wafer W between the ring member 41 and the interface arm 21. The lift pins 48 are arranged such that they do not interfere with the movement of the polishing body 43 and the movement of the pure water supply nozzle 46 during the treatment.

Figure 9:
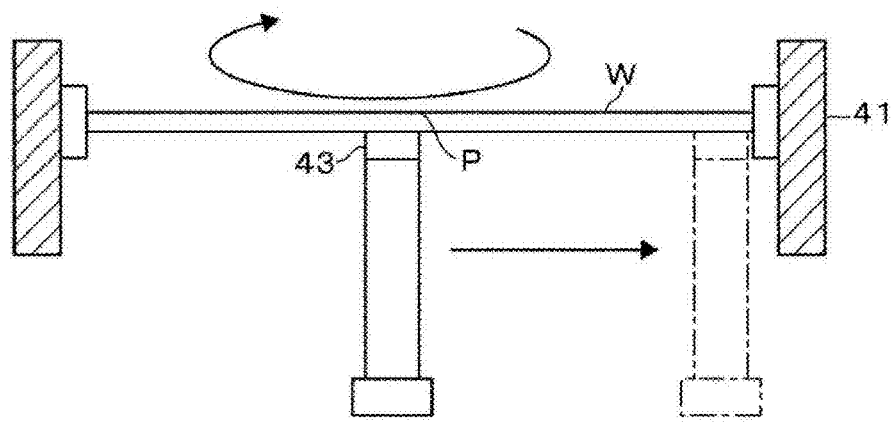
FIG. 9 is an explanatory view of an operation of the roughening treatment module.
Figure 10:
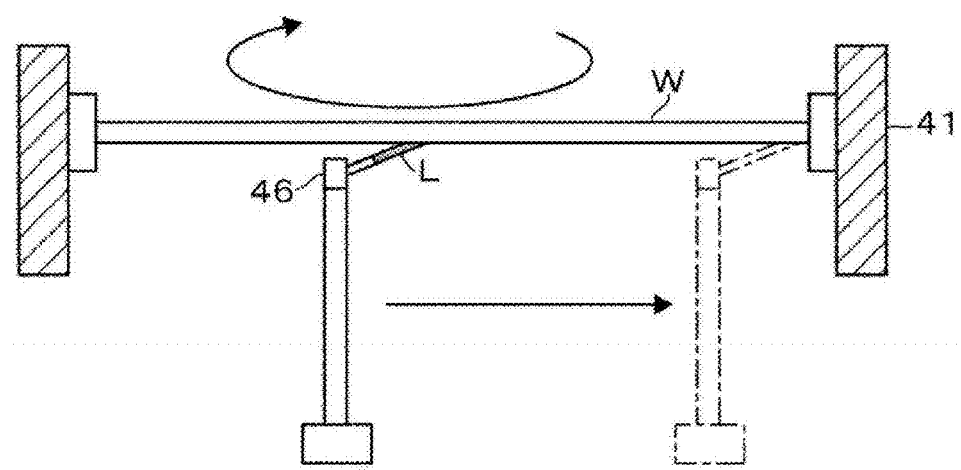
FIG. 10 is an explanatory view of an operation of the roughening treatment module.

The process performed by the roughening treatment module 4 will be described with reference to FIGS. 8 to 10. FIG. 8 illustrates the wafer W that is being rotated during the treatment. In FIG. 8, when viewed from the center P of the wafer W, one end side of the diameter in the movement direction of the polishing body 43 is indicated as "+," and the other side is indicated by "−." In addition, in FIG. 8, positions of the polishing body 43 when each of steps S1 to S6 (which will be described later) is initiated are indicated by T1 to T6, and a position of the polishing body 43 when step S6 is terminated is indicated by T7. FIGS. 9 and 10 illustrate operations of respective parts of the roughening treatment module 4.

First, the wafer W is rotated at 2.0×A rpm (where, A is an arbitrary numerical value larger than zero) by the ring member 41, the polishing body 43 is moved up from a predetermined position below the wafer W, and the polishing body 43 starts to move (scan) in the + direction while pressing the rear surface of the wafer W at the position (position indicated by a solid line in FIG. 9) indicated by T1 in FIG. 8 with, for example, a force of 1 N (step S1). An example of the value A includes 15. In this case, the number of revolutions of the wafer W in step S1 is 30 rpm. In addition, at the position T1, the center Q1 of the polishing body 43 deviates from the center P of the wafer W in the − direction by 15.0 mm. The movement speed of the polishing body 43 in the + direction is, for example, 6 mm/sec.

In this way, the polishing body 43 moves along the wafer W while being in contact with the rear surface of the rotating wafer W, so that the rear surface of the wafer W is polished.

Thus, an innumerable number of fine grooves 10 are formed in the rear surface of the wafer W. These grooves 10 extend to draw Archimedean. Thereafter, as the polishing body 43 continues to move, the center Q1 of the polishing body 43 passes through the center P of the wafer W and moves toward the peripheral portion of the wafer W. In addition, when the polishing body 43 moves and reaches the position T2 in FIG. 8, the number of revolutions of the wafer W increases to be 2.2×A rpm (step S2). In addition, at the position T2, the center Q1 of the polishing body 43 deviates from the center P of the wafer W by 11.0 mm in the + direction.

In addition, the polishing body 43 continues to move and reaches the position T3 in FIG. 8, the number of revolutions of the wafer W decreases to be 1.9×A rpm (step S3). When the polishing body 43 reaches the position T4, the number of revolutions of the wafer W becomes 1.5×A rpm (step S4). When the polishing body 43 reaches the position T5, the number of revolutions of the wafer W becomes 1.3×A rpm (step S5). When the polishing body 43 reaches the position T6 in FIG. 8, the number of revolutions of the wafer W becomes A rpm (step S6). Subsequently, if the polishing body 43 further moves and reaches the position T7 defined in the peripheral portion of the wafer W, the grooves 10 are formed in the entire rear surface of the wafer W. Then, the polishing body 43 is lowered to be spaced apart from the wafer W so that the formation of the grooves 10 is terminated. In addition, at the positions T3, T4, T5, T6, and T7, the center Q1 of the polishing body 43 is spaced apart from the center P of the wafer W in the + direction by 34.5 mm, 60.0 mm, 84.5 mm, 109.0 mm, and 133.5 mm, respectively.

Figure 11:
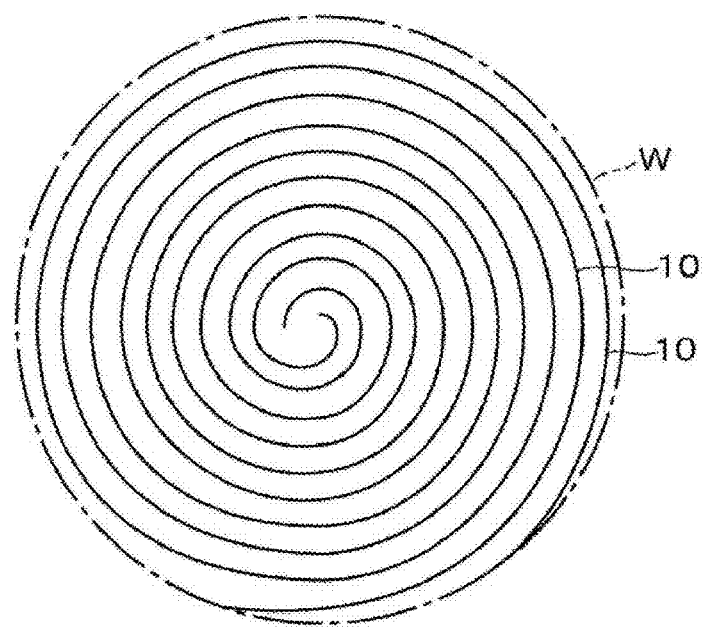
FIG. 11 is a schematic view illustrating grooves formed in a rear surface of a wafer by the roughening treatment module.

FIG. 11 schematically illustrates the grooves 10 formed on the rear surface of the wafer W in steps S1 to S6. Only two grooves are illustrated in FIG. 11, but in fact, an innumerable number of grooves 10 are formed in the Archimedean pattern. That is to say, the grooves 10 are formed in the circumferential direction of the wafer W at positions spaced apart from the center P of the wafer W by different radii. Further, in FIG. 11, gaps between adjacent grooves in one groove 10 are illustrated to be equal to each other when viewed in the diametric direction of the wafer W. However, since the number of revolutions of the wafer W is changed during the polishing treatment, the gaps when viewed in the diametric direction of the wafer W practically vary depending on positions in the diametric direction.

After the polishing-based roughening treatment is performed as described above, the wafer W is rotated at a predetermined number of revolutions. Further, as illustrated in FIG. 10, a pure water L is discharged from the pure water supply nozzle 46 toward the wafer W so that a cleaning treatment is initiated. The pure water supply nozzle 46 is moved such that a position at which the pure water L is supplied is shifted from the center of the rear surface of the wafer W to the peripheral portion of the rear surface. Thus, the pure water is supplied onto the entire rear surface of the wafer W so that chips generated by the polishing treatment are removed from the rear surface of the wafer W. Thereafter, the supply of the pure water is stopped and the cleaning treatment is terminated. Thus, the process in the roughening treatment module 4 is terminated.

Meanwhile, as described above, in each step S, the number of revolutions of the wafer W is increased as the polishing body 43 is positioned closer to the center of the wafer W. If the number of revolutions of the wafer W is constant at each step S, a centrifugal force created by rotating the wafer W is applied to the polishing body 43 at a relatively low level as the polishing body 43 moves toward the center of the wafer W. This makes it difficult to form the grooves 10. In other words, the rear surface of the wafer W is hardly roughened in the central portion thereof. Accordingly, in the above-described polishing treatment, as described above, the number of revolutions of the wafer W is controlled to equalize the centrifugal force of the wafer W, which acts on the polishing body 43 at respective portions of the rear surface of the wafer W. In this way, the entire rear surface of the wafer W is roughened with high uniformity. The reason for making the roughness uniform over the entire rear surface will be described later.

Figure 12:
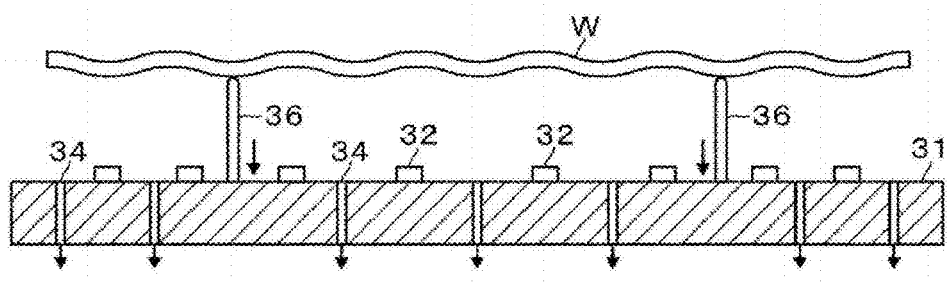
FIG. 12 is an explanatory view illustrating a state in which the wafer with the grooves formed therein is mounted on the stage of the exposure device.
Figure 13:
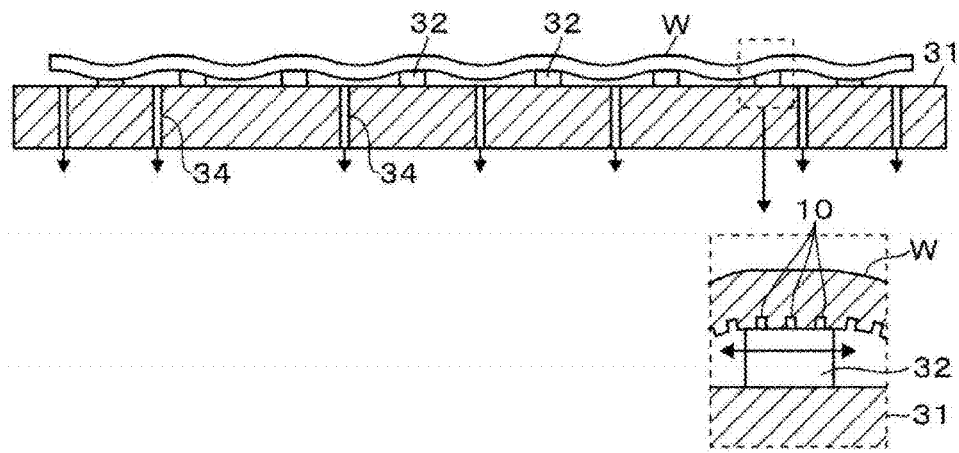
FIG. 13 is an explanatory view illustrating a state in which the wafer with the grooves formed therein is mounted on the stage of the exposure device.
Figure 14:
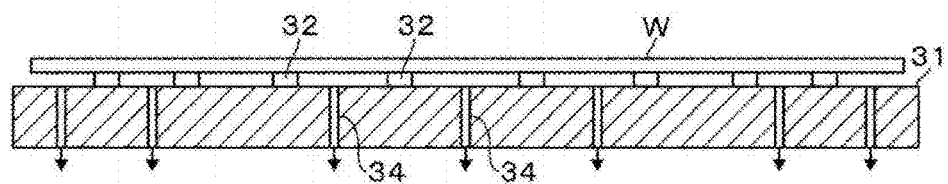
FIG. 14 is an explanatory view illustrating a state in which the wafer with the grooves formed therein is mounted on the stage of the exposure device.

The wafer W which has been subjected to the polishing treatment and the cleaning treatment as described above, is conveyed to the stage 31 of the exposure device D4. After the grooves 10 are formed by the polishing treatment, a roughness alleviating treatment is not performed on the rear surface of the wafer W until the wafer W is conveyed to the exposure device D4. More specifically, an example of the roughness alleviating treatment may include a treatment for flattening the rear surface of the wafer W by supplying a chemical liquid such as hydrofluoric acid that soaks the rear surface of the wafer W. In other words, the wafer W in which the grooves 10 are formed is conveyed to the stage 31. An aspect in which the wafer W is mounted on the stage 31 will be described with reference to FIGS. 12 to 14. In FIGS. 12 to 14, the wafer W is illustrated as being distorted, rather than being a horizontal plate. Further, in a rectangular box indicated by the dotted line in FIG. 13, the pin 32 and the wafer W are illustrated to be scaled up.

The wafer W conveyed on the stage 31 of the exposure device D4 by the interface arm 23 is delivered to the lift pins 36 that have been moved up, and subsequently, the lift pin 36 are moved down (FIG. 12). When the lift pins 36 are moved down, a suction operation is performed through the suction ports 34. Then, the respective portions of the rear surface of the wafer W are mounted on the pins 32. The rear surface of the wafer W is sucked toward the stage 31 by the suction operation through the suction ports 34 (FIG. 13). In this case, since the grooves 10 are formed in the wafer W, a contact area between respective top surfaces of the pins 32 and the rear surface of the wafer W is relatively small. For that reason, a frictional force acting between the rear surface of the wafer W and the top surfaces of the pins 32 is small. Thus, the rear surface of the wafer W which is in the suction state may slide on the top surfaces of the pins 32. As a result, the wafer W is corrected to be extended such that the distortion is removed. Thus, the wafer W is brought into a flat state and is mounted on the pins 32 (FIG. 14). An exposure shot is performed on the wafer W mounted on the stage 31 in this way.

Figure 15:
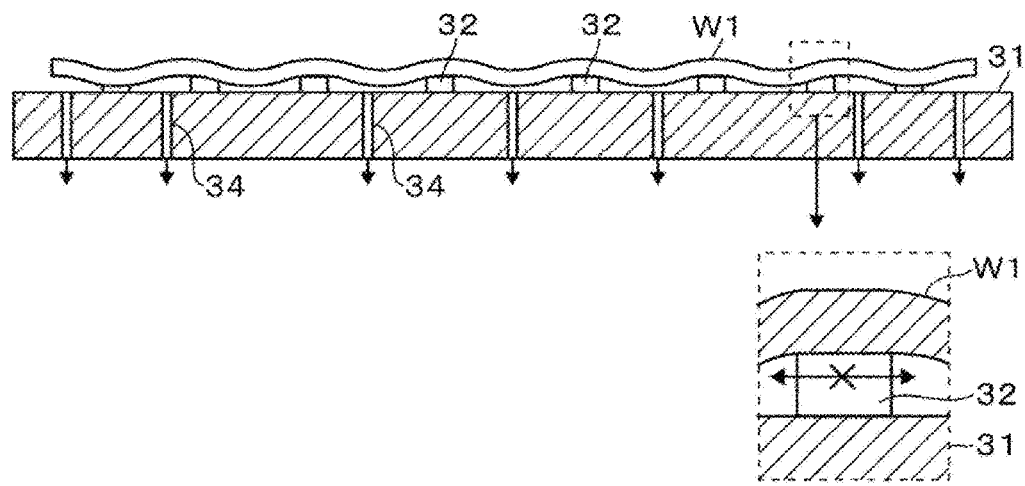
FIG. 15 is an explanatory view illustrating a state in which the wafer without the grooves is mounted on the stage of the exposure device.

For comparison, descriptions will be made on an aspect in which a wafer W1 which is not formed with grooves 10, is mounted on the stage 31. It is assumed that the wafer W1 is conveyed onto the stage 31 while being distorted like the wafer W. First, the wafer W1 is delivered from the interface arm 23 to the lift pins 36 which have been moved up, and subsequently, the lift pins 36 are moved down such that the rear surface of the wafer W1 is mounted on the pins 32. However, because the grooves 10 are not formed, a contact area between the rear surface of the wafer W and the top surfaces of the pins 32 are relatively large. Thus, a frictional force acting between the rear surface of the wafer W and the top surfaces of the pins 32 is large. This makes it difficult for the rear surface of the wafer W to slide on the pins 32 (FIG. 15). Accordingly, the wafer W1 is not formatted on the pins 32. In this state, the wafer W is subjected to the exposure shot while being distorted as illustrated in FIG. 15. As a result, a position where the exposure shot is performed deviates from the normal position. As described above, by forming the grooves 10 in the rear surface of the wafer W, it is possible to mount the wafer W on the stage 31 while keeping a normal horizontal state at the time of exposure. This makes it possible to perform the exposure shot at the normal position.

Meanwhile, as illustrated in FIGS. 4 and 5, the plurality of pins 32 is arranged on the stage 31 along concentric circles. In addition, if uniformity of the frictional force between the respective pins 32 and the rear surface of the wafer W is high, when the wafer W is mounted on the pins 32, the variation in mobility of each portions of the rear surface of the wafer W on the pins 32 is suppressed. This facilities the removal of the distortion of the wafer W. Thus, in the roughening treatment module 4, as described above, the grooves 10 are formed at radially different positions from the center of the wafer W in the circumferential direction, thereby enhancing the uniformity of the frictional force between the rear surface of the wafer W and the respective pins 32. In addition, for the purpose of suppressing a variation in the friction of the rear surface of the wafer W with respect to the respective pins 32, the number of revolutions of the wafer W is changed depending on the position of the polishing body 43 as illustrated in FIG. 8. Thus, roughnesses in respective positions of the rear surface of the wafer W become uniform such that contact areas between the rear surface of the wafer W and the respective pins 32 is made uniform.

Figure 16:
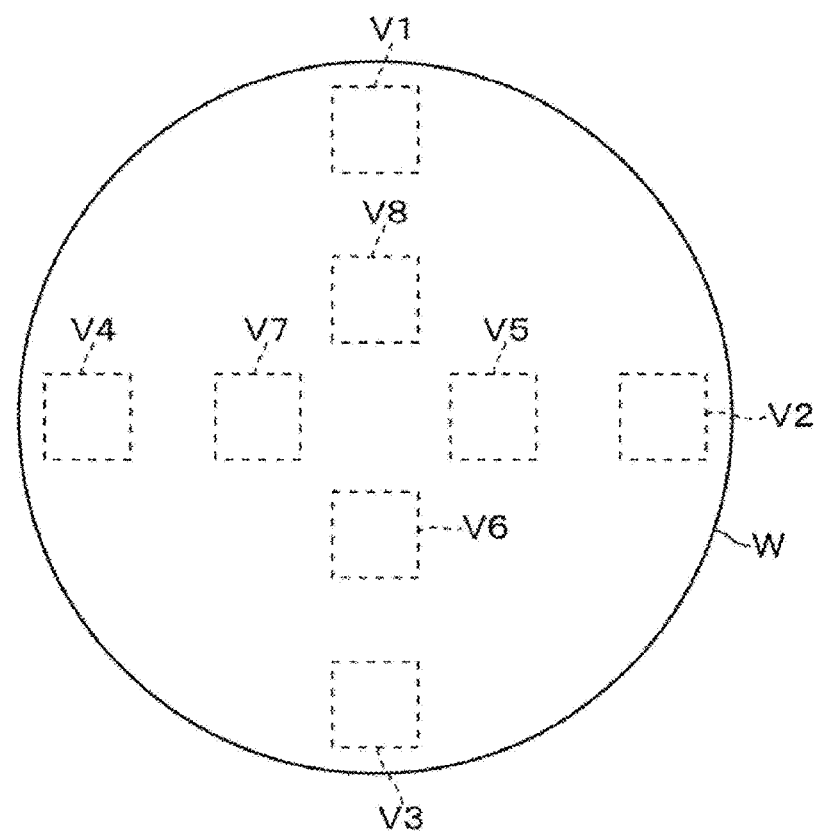
FIG. 16 is a plan view illustrating an example of a region in which a dynamic friction coefficient is measured in the wafer.

In order to remove the distortion of the wafer W on the respective the pins 32 as described above, it is desirable that the average value of dynamic friction coefficients in relation to the pins 32, which were obtained from a plurality of polished regions in the rear surface of the wafer W. In consideration of the concentric arrangement of the pins 32, the plurality of polished regions may be set to be arranged in a mutually spaced-apart relationship along concentric circles centered at the center of the wafer W, as indicated by V1 to V8 in FIG. 16. In some embodiments, a plurality of randomly selected regions having a predetermined size may be set as the plurality of polished regions.

Returning back to FIG. 1, descriptions will be made on a control part 100 provided in the coating/developing apparatus 1. The control part 100 is constituted with, for example, a computer, and includes a program storage part (not illustrated). The program storage part stores a program which is organized with instructions (a step group) for performing the treatments of the wafer W in the respective modules of the coating/developing apparatus 1 and the transfer of the wafer W by the transfer mechanism between the respective modules. In addition, based on the program, the control part 100 outputs a control signal to respective parts of the coating/developing apparatus 1 so as to control the operation of the respective parts of the coating/developing apparatus 1. The program is stored in the program storage part, while being accommodated in a recording medium such as a hard disc, a compact disc, a magnet-optical disc, or a memory card.

Next, descriptions will be made on a transfer path and a treatment of a wafer W in a system including the coating/developing apparatus 1 and the exposure device D4. The wafer W is conveyed from the carrier C to the delivery module TRS0 of the tower G1 in the processing block D2 by the transfer mechanism 13. The wafer W is allocated and conveyed from the delivery module TRS0 to the unit block E1 or E2. For example, in a case where the wafer W is delivered to the unit block E1, the wafer W is delivered from the delivery module TRS0 to the delivery module TRS1 (to which the wafer W can be delivered by the transfer arm F1) corresponding to the unit block E1 among the delivery modules TRS of the tower G1. In addition, in a case where the wafer W is delivered to the unit block E2, the wafer W is delivered from delivery module TRS0 to the delivery module TRS2 corresponding to the unit block E2, among the delivery modules TRS of the tower G1. The delivery of the wafer W is performed by the delivery arm 17.

The wafer W allocated in this way is conveyed in the order of TRS1 (or TRS2)→the anti-reflection film forming module→the heating module→TRS1 (or TRS2). Subsequently, the wafer W is allocated to the delivery module TRS3 corresponding to the unit block E3 or the delivery module TRS4 corresponding to the unit block E4 by the delivery arm 17.

The wafer W allocated to the delivery module TRS3 (or TRS4) is conveyed in the order of TRS3 (or TRS4)→the resist film forming module 15→the heating module 16→TRS31 (or TRS41) of the tower G2. Thereafter, the wafer W is conveyed to the roughening treatment module 4 of the tower G3 by the interface arm 21. In the roughening treatment module 4, the wafer W is subjected to the polishing treatment as illustrated in FIGS. 8 and 9 to form the grooves 10 in the wafer W. Thereafter, the cleaning treatment is performed on the wafer W as illustrated in FIG. 10. After the cleaning treatment, the wafer W is carried into the exposure device D4 by the interface arms 21 and 23. That is to say, after the polishing treatment, the wafer W is conveyed to the exposure device D4 without being subjected to a roughness alleviating treatment for the rear surface of the wafer W, and subsequently, is mounted on the stage 31 as illustrated in FIGS. 12 to 14. In this state, the exposure shot is performed. That is to say, a resist film formed on the surface of the wafer W is exposed along a predetermined pattern.

After being subjected to the exposure treatment, the wafer W is conveyed between the towers G2 and G4 by the interface arms 22 and 23, and subsequently, is conveyed to the delivery module TRS51 (or TRS 61) of the G2, which corresponds to the unit block E5 (or E6). Thereafter, the wafer W is conveyed in the order of the heating module 16→the developing module where the resist film is dissolved along the pattern exposed by the exposure device D4. In this way, a resist pattern is formed on the wafer W. Thereafter, the wafer W is conveyed to the delivery module TRS5 (or TRS6) of the tower G1, and subsequently, is returned to the carrier C by the transfer mechanism 13.

According to the coating/developing apparatus 1, the rear surface of the wafer W is subjected to the roughening treatment by the roughening treatment module 4 before the wafer is carried into the exposure device D4, and subsequently, the wafer W is carried into the exposure device D4 without being subjected to the roughness alleviating treatment for the rear surface. Thus, friction between the top surfaces of the pins 32 of the stage 31 of the exposure device D4 and the rear surface of the wafer W is reduced so that the wafer W having a suppressed distortion can be mounted on the stage 31. It is therefore possible to suppress a position where an exposure shot is performed from deviating from a normal position. This improves overlay exposure.

The position where the roughening treatment module 4 is installed is not limited to the interface block D3. For example, the roughening treatment module 4 may be installed instead of one of the plurality of anti-reflection film forming modules or one of the plurality of resist film forming modules 15 in the processing block D2. In some embodiments, the roughening treatment module 4 may be installed outside the coating/developing apparatus 1, and the wafer W having the grooves 10 formed therein may be conveyed to the coating/developing apparatus 1 by the carrier C.

In the roughening treatment module 4, the movement speed of the polishing body 43 is set to be constant, but the movement speed of the polishing body 43 may be changed depending on the position of the polishing body 43. For example, as described above, since the centrifugal force is weak at the center side of the wafer W compared to the peripheral portion side of the wafer W, the wafer W is hardly roughened at the center side of the wafer W. Thus, when the polishing body 43 is positioned at the peripheral portion side, the polishing body 43 may be configured to move at a first speed. Meanwhile, when the polishing body 43 is positioned at the center side, the polishing body 43 may be configured to move at a second speed that is lower than the first speed such that the polishing body 43 may be in contact with the wafer W for a relatively long period of time. In this way, the center side of the wafer W can be roughened. In some embodiments, the number of revolutions of the wafer W during the polishing treatment may be set to be constant regardless of the position of the polishing body 43 in the diametric direction of the wafer W. In some embodiments, the grooves 10 may be formed in the entire rear surface of the wafer W by moving the polishing body 43 from the peripheral portion side of the wafer W to the center side thereof.

While in the above embodiment, the grooves 10 have been described to be formed in a spiral shape, they may be formed in concentric circular shapes. More specifically, for example, in the state where the position of the polishing body 43 is fixed, the wafer W is rotated and subjected to the polishing treatment. Thereafter, the polishing body 43 is lowered to be separated from the wafer W, and subsequently, is shifted in the diametric direction of the wafer W. Thereafter, the polishing body 43 is moved up to come into contact with the wafer W. Similarly, the wafer W is rotated and again subjected to the polishing treatment in the state where the position of the polishing body 43 is fixed. By repeating the rotation of the wafer W and the movement of the polishing body 43, it is possible to form the grooves in concentric circular shapes. However, as shown in evaluation experiments to be described below, when the wafer W is rotated and subjected to the polishing treatment in the state where the position of the polishing body 43 is fixed, a variation in roughness is caused within the polished regions in the diametric direction of the wafer W. Because of this issue, as illustrated in FIGS. 8 and 9, it is effective to form the grooves 10 in the spiral shape by moving the polishing body 43 while rotating the wafer W.

Figure 17:
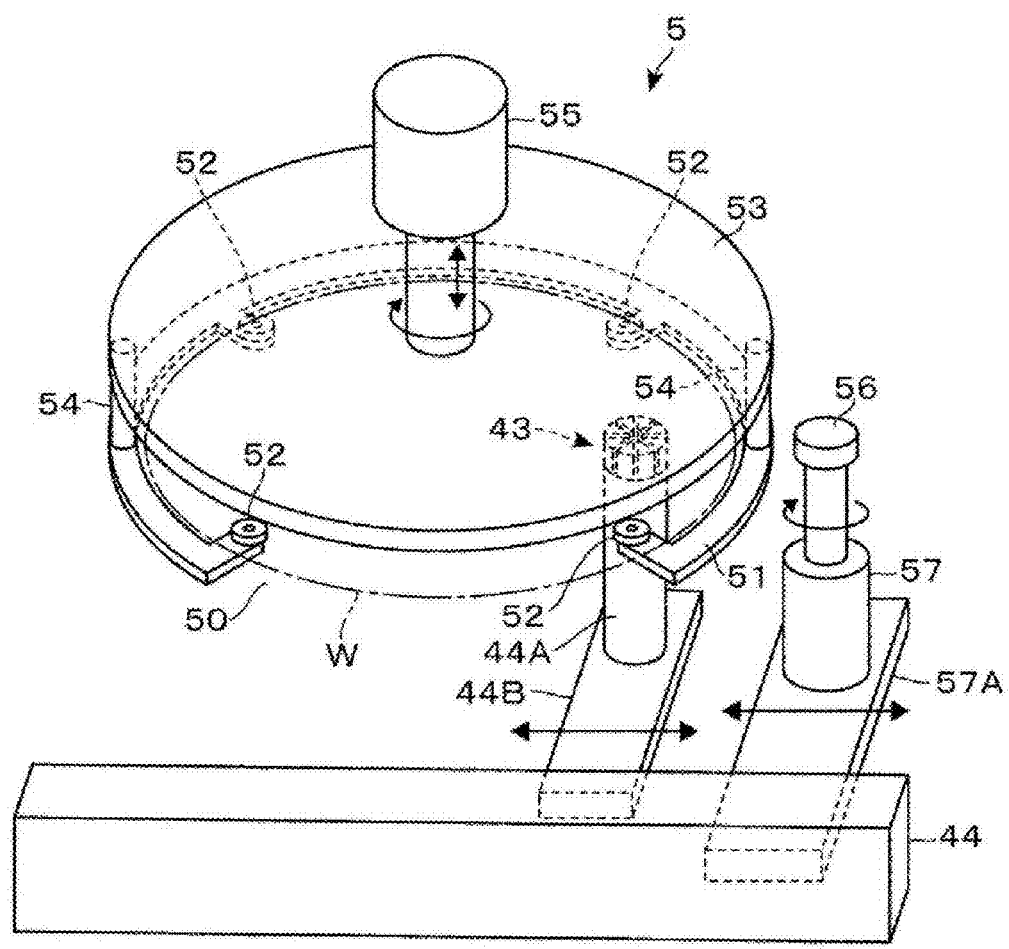
FIG. 17 is a perspective view illustrating a roughening treatment module having another configuration.

Next, a roughening treatment module 5 as another configuration example of the roughening treatment module 4 will be described with reference to a perspective view of FIG. 17, with a focus on the differences between the roughening treatment module 4 and the roughening treatment module 5. In FIG. 17, reference numeral "51" indicates a horizontal ring member which has a cutoff portion 50 formed therein. In an inner periphery side of the ring member 51, there are four suction parts 52 which are formed to protrude toward the center of the ring member 51 and configured to suck the peripheral portion of the rear surface of the wafer W to horizontally hold the wafer W. The four suction parts 52 are spaced apart from each other in the circumferential direction of the ring member 51. In FIG. 17, reference numeral "53" indicates a circular plate which is installed above the ring member 51 while being spaced apart from the ring member 51. In FIG. 17, reference numeral "54" indicates a column which interconnects the ring member 51 and the circular plate. In FIG. 17, reference numeral "55" indicates a driving mechanism connected to the circular plate 53, which is capable of moving the ring member 51 up and down as well as rotating the ring member 51 in the circumferential direction via the circular plate 53.

In addition, in FIG. 17, reference numeral "56" indicates a spin chuck which sucks the center of the rear surface of the wafer W and is configured to be rotated by a rotating mechanism 57. The rotating mechanism 57 is coupled to the moving mechanism 44 through an arm 57A. The moving mechanism 44 can move the arm 44B configured to support the polishing body 43 and the arm 57A along the diametric direction of the wafer W independently of one another. With the movement of the arm 57A, the spin chuck 56 is movable between the outside of the ring member 51 and below the central portion of the rear surface of the wafer W held by the ring member 51.

Although not illustrated, the roughening treatment module 5 includes a pure water supply nozzle 46 and a moving mechanism configured to move the pure water supply nozzle 46, like the roughening treatment module 4. The pure water supply nozzle 46 moves below the rear surface of the wafer W such that the pure water supply nozzle 46 does not interfere with the spin chuck 56 and the polishing body 43. The roughening treatment module 5 is not provided with the lift pins 48. Thus, a delivery of the wafer W between the ring member 51 and the interface arm 21 is performed by the up-down movement of the ring member 51. The cutoff portion 50 of the ring member 51 is formed not to interfere with the interface arm 21 which is oriented from an inward portion to an outward portion of the ring member 51 in the course of the delivery.

Figure 18:
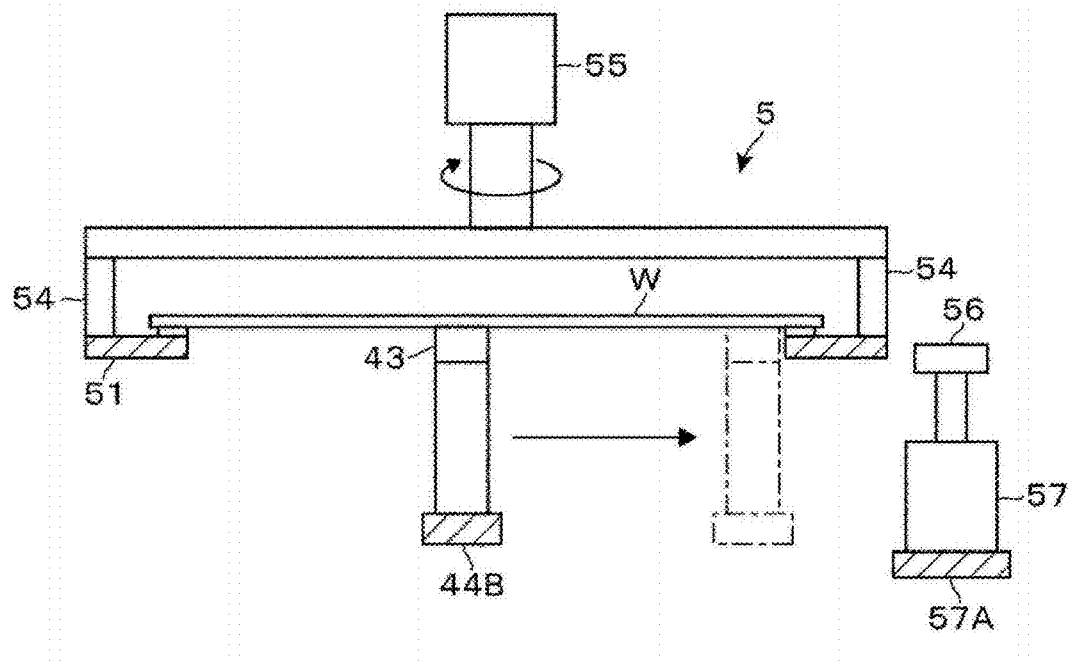
FIG. 18 is an explanatory view illustrating an operation of the roughening treatment module.
Figure 19:
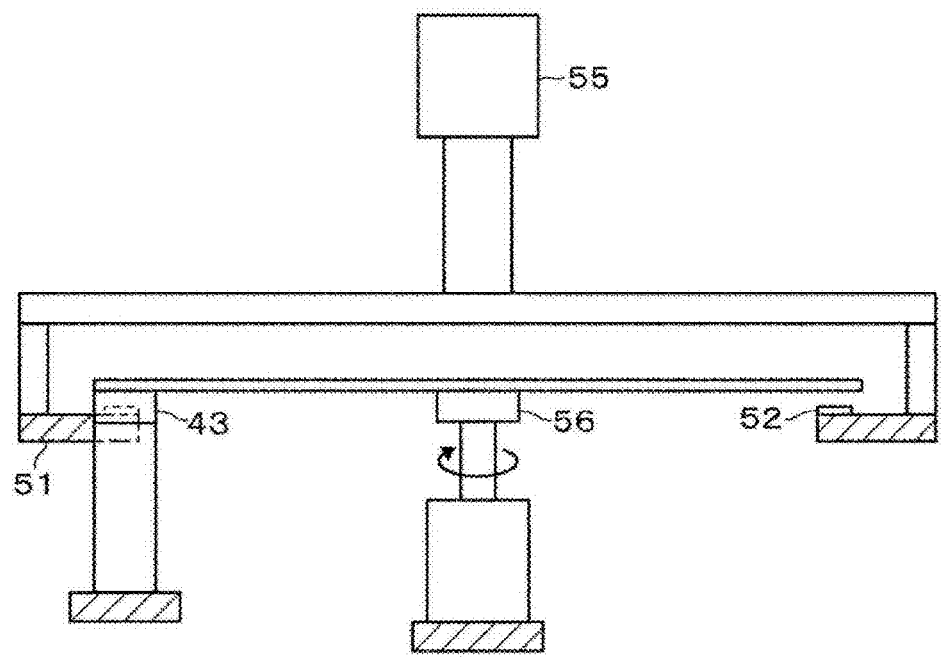
FIG. 19 is an explanatory view illustrating an operation of the roughening treatment module.

A polishing treatment performed by the roughening treatment module 5 will be described with reference to FIGS. 18 and 19. First, the wafer W is rotated while the peripheral portion thereof is held by the ring member 51. Subsequently, at the position T1 illustrated in FIG. 8 (position indicated by a solid line in FIG. 18), the polishing body 43 presses against the rear surface of the wafer W to initiate the polishing treatment, and simultaneously, moves toward the peripheral portion of the wafer W along the diameter of the wafer W. In order not to interfere with the suction part 52, the polishing body 43 is stopped at a position more inward of the peripheral portion of the wafer W (e.g., a position indicated by a chain line in FIG. 18). Thereafter, the polishing body 43 moves down to be spaced apart from the wafer W. In addition, the rotation of the wafer W is stopped, and the ring member 51 is moved up.

Subsequently, the spin chuck 56 is moved to below the central portion of the wafer W and the ring member 51 is moved down such that the peripheral portion of the wafer W is spaced apart from the ring member 51 and the central portion of the rear surface of the wafer W is held on the spin chuck 56. Thereafter, the wafer W is rotated by the spin chuck 56, and the polishing body 43 is moved to below the peripheral portion of the wafer W and then moved up to press against the rear surface of the wafer W. In this way, the peripheral portion of the rear surface of the wafer W is polished (FIG. 19). Thereafter, the polishing body 43 is moved down to be spaced apart from the wafer W, and the polishing treatment is terminated. Subsequently, the cleaning treatment is performed as in the roughening treatment module 4.

As described above, the polishing treatment is performed even in the roughening treatment module 5, thereby forming a plurality of grooves in the rear surface of the wafer W. Thus, the roughening treatment module 5 provides the same effects as the polishing treatment performed by the roughening treatment module 4. In some embodiments, the aforementioned methods may be combined with each other. As an example, even in the roughening treatment module 5, the number of revolutions of the wafer W may be changed depending on the position of the polishing body 43, as in the roughening treatment module 4.

EVALUATION EXPERIMENT

Hereinafter, descriptions will be made on evaluation experiments, which were performed in relation with the present disclosure.

Evaluation Experiment 1

A polishing treatment for a rear surface of a wafer W was performed using an experiment apparatus that is configured similar to the roughening treatment module 4. However, unlike the above-described polishing treatment, the polishing body 43 was not moved during the rotation of the wafer W such that only the peripheral portion of the rear surface of the wafer W is restrictedly polished. In addition, the Haze value was measured by irradiating laser light toward polished regions along the diameter direction of the wafer W, and receiving light scattered from the wafer W. The Haze value represents a ratio of the intensity of the scattered light to the intensity of the laser light. The Haze value corresponds to roughness. As the Haze value becomes high, irregularities are densely formed. In addition, a shape of the polishing body 43 used in this experiment is similar to that described in the above embodiment of the present disclosure.

Figure 20:
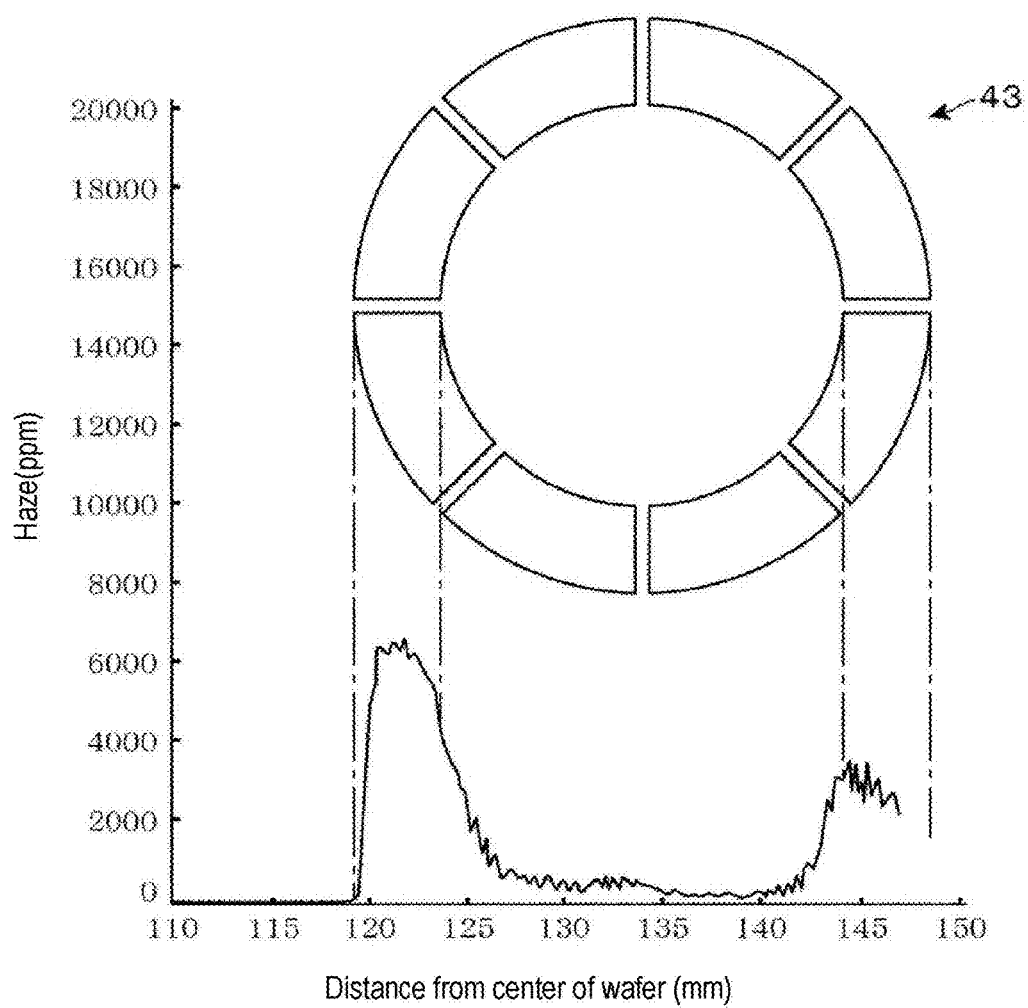
FIG. 20 is a graph representing a result of an evaluation experiment.

A graph of FIG. 20 illustrates the results of Evaluation Experiment 1. In FIG. 20, a horizontal axis of the graph represents a distance from the center of the wafer W (unit: mm), and a vertical axis of the graph represents the Haze value (unit: ppm). In addition, positions where the polishing body 43 is disposed during the experiment are indicated to be mapped to the horizontal axis of the graph. As illustrated in FIG. 20, a region spaced apart from the center of the wafer W by a range of 118 mm to 148 mm was polished. As can be seen from the graph, the Haze value greatly fluctuated within the polished region. It is assumed that, in the polishing body 43, a side near to the center of the wafer W is one end portion and a side near to the peripheral portion of the wafer W is the other end portion. The Haze value in a region, which was polished by the one end portion of the polishing body 43 and spaced apart from the center of the wafer W by a distance of 120 mm to 125 mm, was 4,000 to 6,500 ppm. The Haze value in a region, which was polished by the other end portion of the polishing body 43 and spaced apart from the center of the wafer W by a distance of 143 mm to 148 mm, was 2,000 to 3,500 rpm. In addition, the Haze value in almost every position within regions polished by a portion other than the one end portion and the other end portion of the polishing body 43, was 1,000 rpm or less.

As described above, the experiment shows that, if the wafer W under rotation is polished while fixing the position of the polishing body 43, a relatively large variation in roughness in the diametric direction of the wafer W occurred. Accordingly, to address such a variation in roughness, it is believed that it is effective to perform the polishing treatment while moving the polishing body 43 as illustrated in FIG. 8.

Evaluation Experiment 2

A polishing treatment was performed on a plurality of wafers W using an experiment apparatus that is configured similar to the roughening treatment module 4. In Evaluation Experiment 2, the entire rear surface of the wafer W was polished while moving the polishing body 43 along the diameter of the wafer W as illustrated in FIG. 8. However, the polishing treatment was performed in the state where the number of revolutions of the wafer W during the polishing treatment is set to be constant without changing depending on the position of the polishing body W, and in the state where the numbers of revolutions of the respective wafers W are differently set. The wafers W, of which the number of revolutions were set to 15 rpm, 30 rpm, and 300 rpm, are referred to as a wafer 61, a wafer 62, and a wafer 63, respectively.

After the polishing treatment, the Haze value was measured at respective portions of the wafers 61 and 62 along the wafer diametric direction as in Evaluation Experiment 1. In addition, for the wafers 61 and 62, an image which represents an in-plane Haze distribution of the rear surface of each of the wafers 61 and 62, was acquired. Further, for the wafers 61 to 63, a trajectory of the center Q1 of the polishing body 43 in the rear surface of each of the wafers was obtained by a simulation. Further, an arithmetic average roughness Ra (unit: nm) of a region (hereinafter sometimes referred to as an inspection region 60) surrounded by a square with a side length of 90 μm, was obtained. In addition, for each of the wafers 61 to 63, dynamic friction coefficients of the respective wafer to the pins 32 of the stage 31 of the exposure device D4 were obtained.

Figure 21:
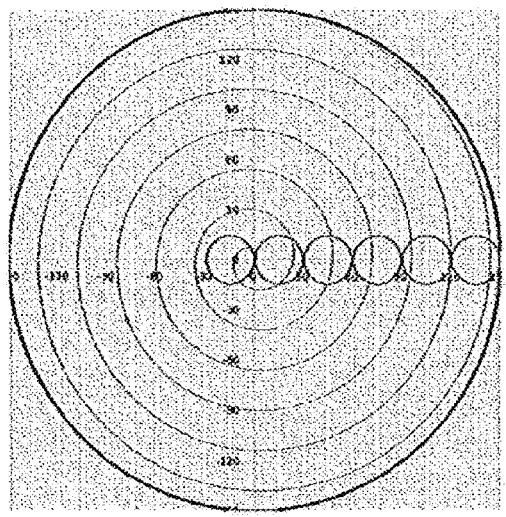
FIG. 21 is an explanatory view illustrating a result of a simulation.
Figure 22:
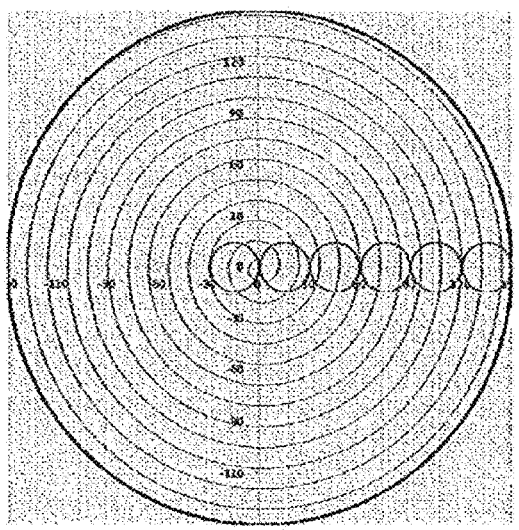
FIG. 22 is an explanatory view illustrating a result of a simulation.
Figure 23:
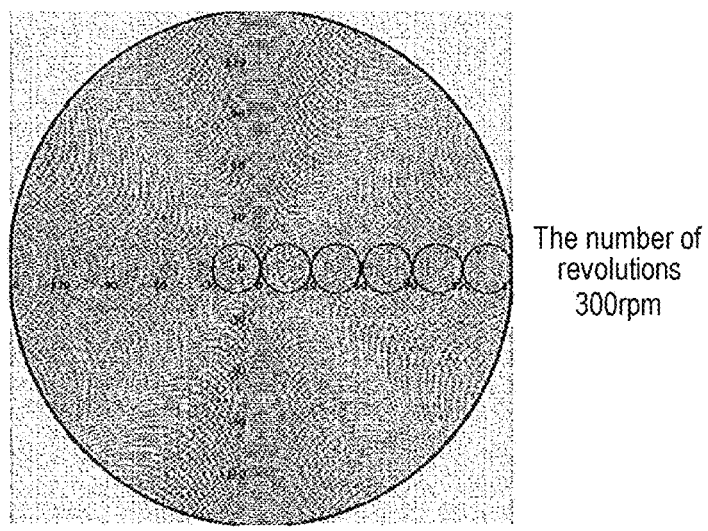
FIG. 23 is an explanatory view illustrating a result of a simulation.
Figure 24:
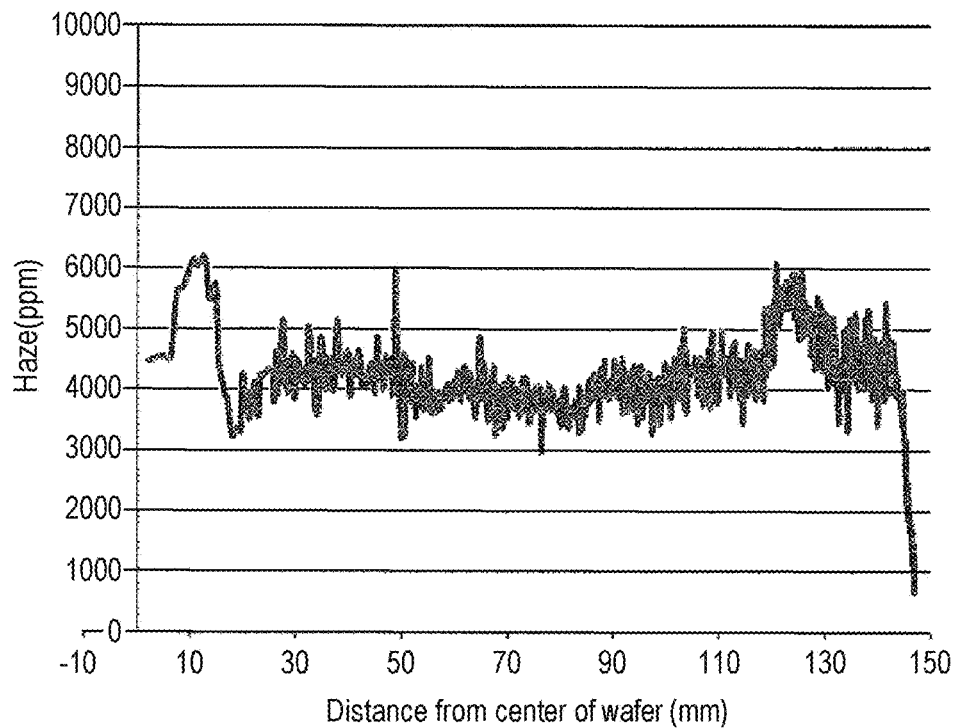
FIG. 24 is a graph representing a result of an evaluation experiment.
Figure 25:
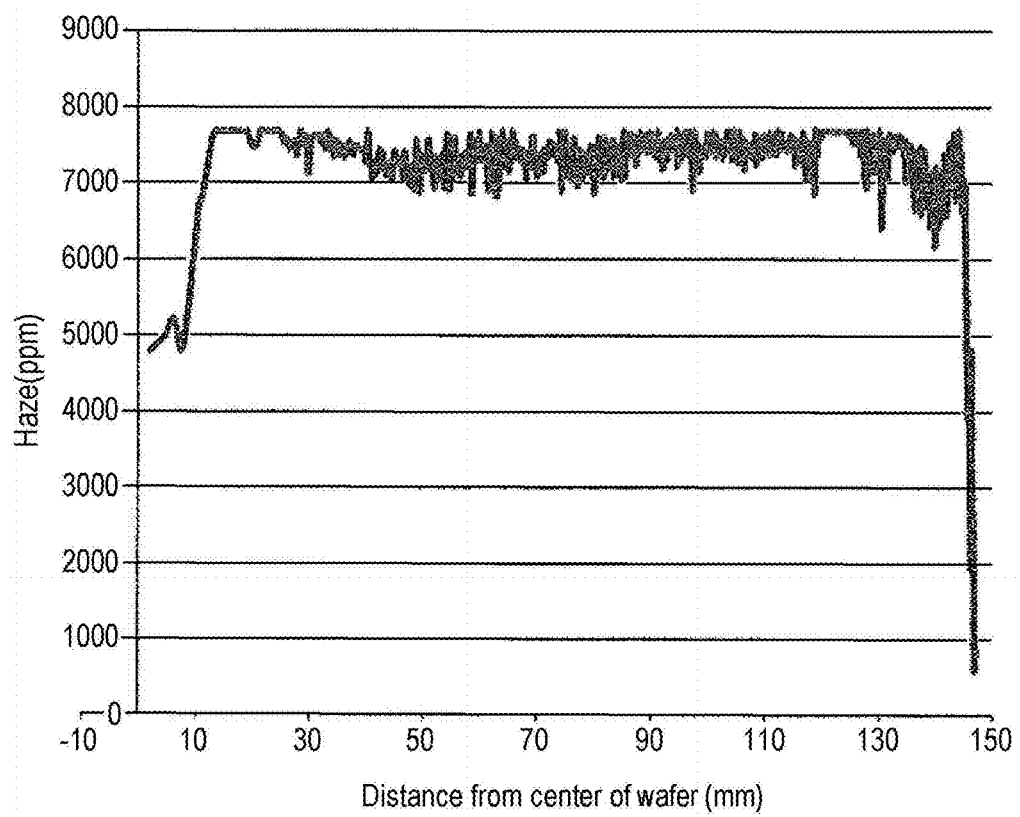
FIG. 25 is a graph representing a result of an evaluation experiment.
Figure 26:
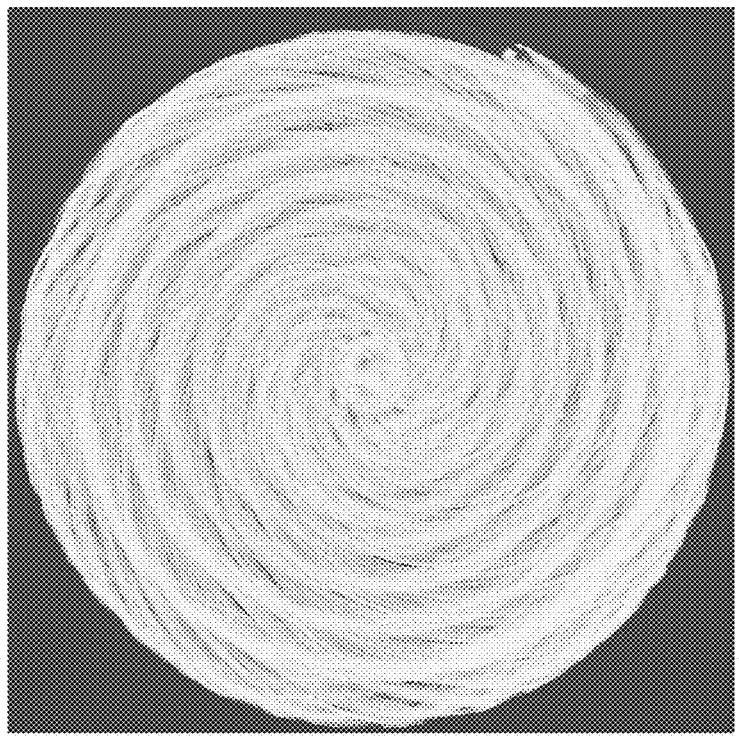
FIG. 26 is an explanatory view illustrating an image obtained by an evaluation experiment.
Figure 27:
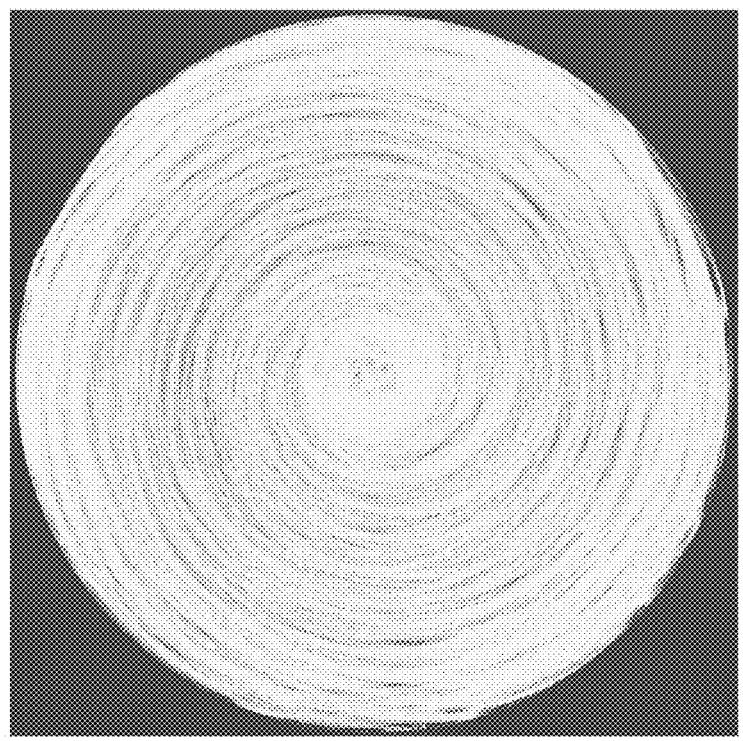
FIG. 27 is an explanatory view illustrating an image obtained by an evaluation experiment.

Each of FIGS. 21, 22, and 23 illustrates a trajectory of the center Q1 of the polishing body 43 corresponding to each of the wafer 61, the wafer 62, and the wafer 63. As illustrated in each of FIGS. 21, 22, and 23, as the number of revolutions is increased, the trajectory of the center Q1 of the polishing body 43 become dense. FIGS. 24 and 25 are graphs representing Haze values of respective portions in the wafer diametric direction, which were obtained from the wafer 61 and the wafer 62, respectively. The vertical axis and the horizontal axis in each of FIGS. 24 and 25 represent a Haze value and a distance from the center of the respective wafer, respectively, like the graph of FIG. 20. In addition, FIGS. 26 and 27 are images representing in-plane Haze distributions in the rear surfaces of the wafers 61 and 62, respectively. Wherein, a Haze size distribution is represented by a gray-scaled image. That is to say, the gray-scaled image represents irregularities formed in the rear surface of the wafer W.

As can be seen from the graphs of FIGS. 24 and 25, the wafer 62 has a larger Haze at each portion compared to the wafer 61. In addition, in the images of FIGS. 26 and 27, the gray-scaled image in the wafer 62 is expressed more finely than that in the wafer 61. As can be seen from the graphs and the images, irregularities are formed more finely and more densely in the wafer 62, which was rotated at a higher number of revolutions than the wafer 61 during the polishing treatment.

Figure 28:
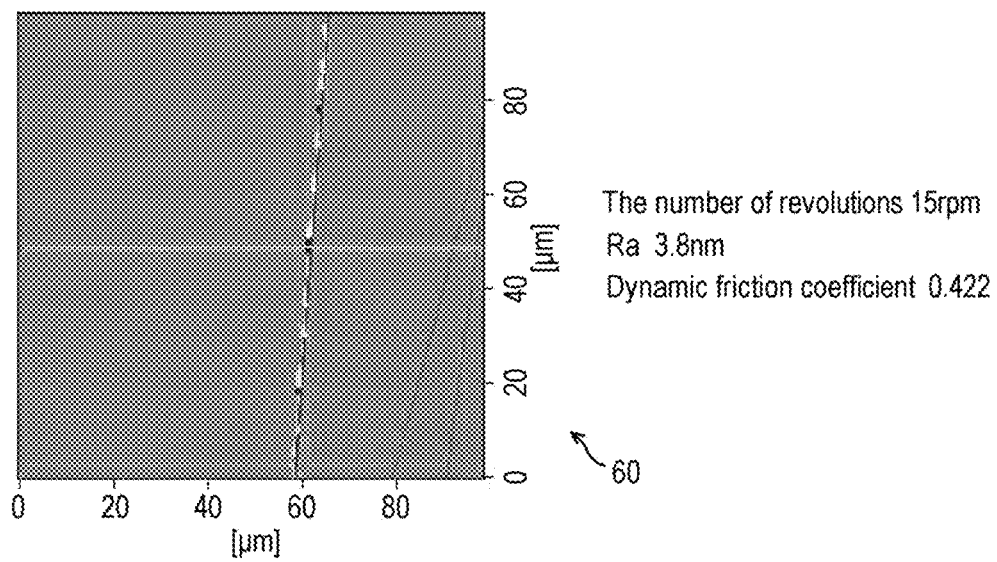
FIG. 28 is an explanatory view illustrating an image obtained by an evaluation experiment.
Figure 29:
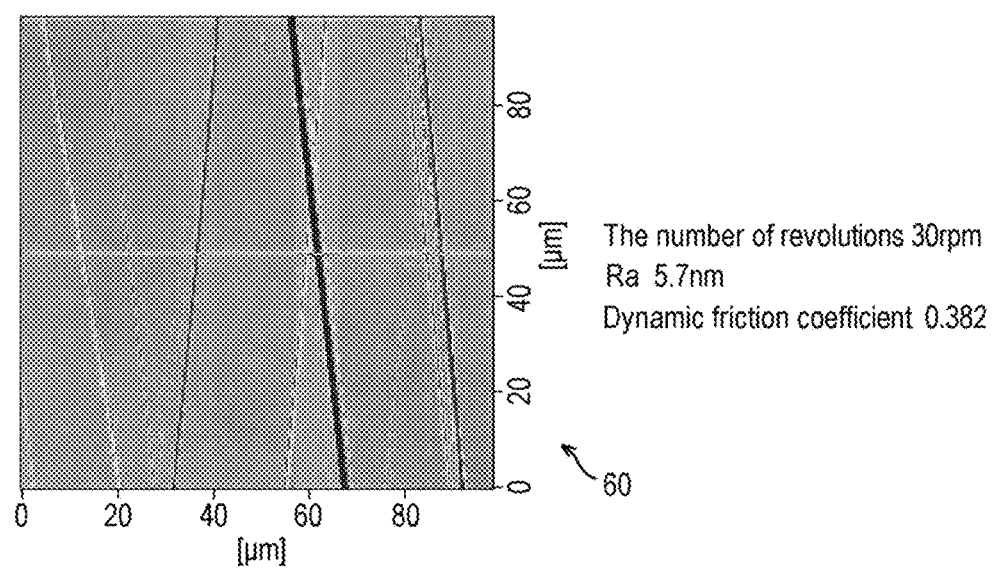
FIG. 29 is an explanatory view illustrating an image obtained by an evaluation experiment.
Figure 30:
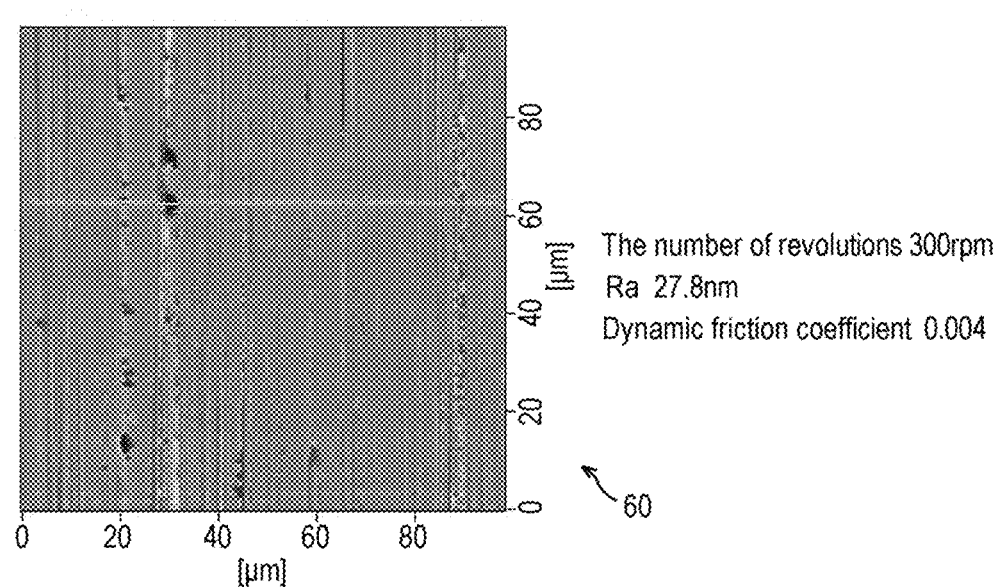
FIG. 30 is an explanatory view illustrating an image obtained by an evaluation experiment.

Each of FIGS. 28, 29, and 30 illustrates images inspected in the inspection regions 60 of the wafer 61, the wafer 62, and the wafer 63, respectively. Arithmetic average roughnesses Ra acquired from the respective inspection regions 60 of the wafers 61, 62, and 63 were 3.8 nm, 5.7 nm, and 27.8 nm, respectively. In addition, Dynamic friction coefficients acquired from the wafers 61, 62, and 63 were 0.422, 0.382, and 0.004, respectively. Because the dynamic friction coefficient of the wafer W, which was not subjected to the polishing treatment, was 0.435, it has been confirmed that the dynamic friction coefficient can be lowered by performing the polishing treatment.

From the results of Evaluation Experiment 2, the following features have been confirmed. The polishing treatment is performed while increasing the number of revolutions of the wafer W, so that the trajectory of the center of the polishing body 43 becomes dense. Thus, the Haze value in each portion of the wafer W is increased so that the arithmetic average roughness Ra is increased. This decreases the dynamic friction coefficient. The rear surface of the wafer W easily slides on the pins 32 as the dynamic friction coefficient is decreased. Thus, this experiment provides more beneficial effects than the aforementioned effects of the present disclosure.

Evaluation Experiment 3

Wafers 601 to 604 were prepared, each of which has a warp level of 300 μm and is not formed with a film on the rear surface thereof. The wafer 601 was carried into the exposure device D4 without polishing the rear surface after resist coating. The rear surface of each of the wafers 602 to 604 was polished after the resist coating and before exposure, like the wafers 61 to 63 in Evaluation Experiment 2. Thereafter, each of the wafers 602 to 604 was carried into the exposure device D4. The number of revolutions of each of the wafers 602, 603, and 604 during the polishing treatment was set to 15 rpm, 30 rpm, and 300 rpm, like the number of revolutions of the wafers 61, 62, and 63 in Evaluation Experiment 2. In addition, overlays for the wafers 601 to 604 were measured in the exposure device D4. The overlays correspond to an amount of deviation in the X direction and the Y direction which are orthogonal to each other on the surface of each wafer.

Images of each wafer W in FIG. 31 represent the results of Evaluation Experiment 3. More specifically, each of the images is expressed by overlapping a previous exposed pattern with a subsequent exposed pattern. For the wafer 601, the overlays in the X direction and the Y direction were 8.4 nm and 8.8 nm, respectively. For the wafer 602, the overlays in the X direction and the Y direction were 9.3 nm and 9.7 nm, respectively. For the wafer 603, the overlays in the X direction and the Y direction were 9.8 nm and 9.9 nm, respectively. For the wafer 604, the overlays in the X direction and the Y direction were 6.3 nm and 7.5 nm, respectively.

An overlay improvement rate was calculated to measure a degree of improvement in overlay between the wafer 601 whose rear surface has not been subjected to the polishing treatment and each of the wafers 602 to 604 whose rear surface has been subjected to the polishing treatment. The overlay improvement rate is expressed as follows: $\{1-(XY$ combined movement distance of the wafers 601 to 604)/(XY combined movement distance of the wafer 601)$\}\times 100(\%)$. Wherein, the XY combined movement distance is expressed as follows: $\{(\text{overly in the X direction})^2+(\text{overly in the Y direction})^2\}^{1/2}$. Accordingly, the higher degree of the overlay improvement rate shows that the deviation of an exposure position from a correct position is suppressed. The overlay improvement rate of the wafer 604 is $1-\{\{(6.3)^2+(7.5)^2\}+\{(8.4)^2+(8.8)^2\}\}^{1/2}\times 100=19.5\%$. The overlay improvement rates of the wafers 601, 602, and 603 are 0.0%, −10.5%, and −14.5%, respectively.

From the results of Evaluation Experiment 3, it has been found that the wafer 604 of which the number of revolutions was set to 300 rpm during the polishing treatment, has an improved overlay OL. From the results of Evaluation Experiment 2 and the results of Evaluation Experiment 3, it has been found that when the dynamic friction coefficient was set to 0.004 or less, the overlay is improved.

According to the present disclosure, a rear surface of a substrate used as a semiconductor wafer is polished such that the rear surface is subjected to a roughening treatment. Thus, a contact area between the rear surface and a stage on which the substrate is mounted in a suctioned state during exposure, is reduced. This makes it possible to allow the rear surface of the sucked substrate to slide on the stage. Thus, the substrate is corrected along a surface of the stage, thereby removing distortion of the substrate on the stage. Therefore, it is possible to suppress a position where the substrate is exposed from being deviated from a normal position. This improves overlay exposure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprises:
polishing a rear surface of a substrate before a pattern exposure such that the rear surface is subjected to a roughening treatment; and
bypassing a roughness alleviating treatment with respect to the polished rear surface of the substrate.

2. The method of claim 1, wherein the polishing of the rear surface of the substrate is performed to reduce friction between the rear surface of the substrate and top surfaces of a plurality of protrusions formed in a substrate stage of a pattern exposure device, the substrate being mounted on the substrate stage of the pattern exposure device in a suctioned state.

3. The method of claim 1, wherein the polishing further includes forming grooves in the rear surface of the substrate in a circumferential direction of the substrate, wherein the grooves are formed at different positions from a center of the substrate in a radial direction of the substrate.

4. The method of claim 1, further comprising: after the polishing, cleaning the rear surface of the substrate by a pure water.

5. The method of claim 1, wherein the polishing further includes scanning a polishing body between a central portion of the rear surface of the substrate and a peripheral portion of the rear surface while rotating the substrate.

6. A substrate processing apparatus which forms a resist film on a substrate and develops the substrate after a pattern exposure, comprising:
a polishing treatment part configured to polish a rear surface of the substrate such that the rear surface of the substrate is subjected to a roughening treatment before the pattern exposure,
wherein a roughness alleviating treatment is not performed on the polished rear surface.

7. The apparatus of claim 6, wherein the polishing treatment part includes:
a mechanism configured to hold a peripheral portion of the rear surface of the substrate or an outer periphery end of the substrate and to rotate the substrate;

a polishing body configured to polish the rear surface of the substrate; and a moving mechanism configured to move the polishing body between a central portion of the substrate and a peripheral portion of the substrate.

8. The apparatus of claim 7, further comprising:

a mechanism used in polishing the peripheral portion of the rear surface of the substrate by the polishing body, and configured to hold a central portion of the rear surface of the substrate in a suctioned state and to rotate the substrate.

* * * * *